US011895850B2

(12) United States Patent
Han

(10) Patent No.: US 11,895,850 B2
(45) Date of Patent: Feb. 6, 2024

(54) VARIABLE RESISTANCE MEMORY DEVICE

(71) Applicant: SAMSUNG ELECTRONICS CO., LTD., Suwon-si (KR)

(72) Inventor: Min Chul Han, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 301 days.

(21) Appl. No.: 17/496,000

(22) Filed: Oct. 7, 2021

(65) Prior Publication Data

US 2022/0293680 A1    Sep. 15, 2022

(30) Foreign Application Priority Data

Mar. 12, 2021    (KR) .................. 10-2021-0032764

(51) Int. Cl.
*H10B 63/00*    (2023.01)

(52) U.S. Cl.
CPC ............ *H10B 63/80* (2023.02); *H10B 63/24* (2023.02)

(58) Field of Classification Search
CPC ............................. H10B 63/00; H10N 70/00
See application file for complete search history.

(56) References Cited

U.S. PATENT DOCUMENTS

| | | | |
|---|---|---|---|
| 8,427,859 B2 | 4/2013 | Sandhu et al. |
| 9,118,009 B2 | 8/2015 | Terai et al. |
| 9,559,146 B2 | 1/2017 | Liu et al. |
| 9,812,501 B2 | 11/2017 | Lee et al. |
| 10,276,591 B2 | 4/2019 | Lee et al. |
| 10,515,819 B2 | 12/2019 | Park et al. |
| 2006/0239077 A1 | 10/2006 | Park et al. |
| 2007/0058428 A1 | 3/2007 | Kang et al. |
| 2020/0091240 A1 | 3/2020 | Hong |

FOREIGN PATENT DOCUMENTS

| | | |
|---|---|---|
| KR | 10-0704025 B1 | 4/2007 |
| KR | 10-0754894 B1 | 9/2007 |
| KR | 10-2008-0017636 A | 2/2008 |

*Primary Examiner* — Marvin Payen
(74) *Attorney, Agent, or Firm* — Muir Patent Law, PLLC

(57) ABSTRACT

A variable resistance memory device includes memory cell structures on a substrate and spaced apart from each other in first and second directions, the first and second directions being parallel to a top surface of the substrate and intersecting each other, and a dummy cell structure surrounding each of the memory cell structures, as viewed in a plan view, the dummy cell structure being a single body structure extending continuously between all the memory cell structures, wherein each of the memory cell structures includes first conductive line on and intersecting second conductive lines, and memory cells between the first and second conductive lines, and wherein the dummy cell structure includes first dummy conductive lines on and intersecting second dummy conductive lines, and dummy memory cells between the first and second dummy conductive lines.

20 Claims, 18 Drawing Sheets

VARIABLE RESISTANCE MEMORY DEVICE

CROSS-REFERENCE TO RELATED APPLICATION

This U.S. non-provisional patent application claims priority under 35 U.S.C. § 119 to Korean Patent Application No. 10-2021-0032764, filed on Mar. 12, 2021, in the Korean Intellectual Property Office, the disclosure of which is hereby incorporated by reference in its entirety.

BACKGROUND

1. Field

Embodiments relate to a semiconductor device and, more particularly, to a variable resistance memory device.

2. Description of the Related Art

Semiconductor memory devices may be classified into volatile memory devices and non-volatile memory devices. The volatile memory devices may lose their stored data when their power supplies are interrupted. For example, the volatile memory devices may include dynamic random access memory (DRAM) devices and static random access memory (SRAM) devices. On the contrary, the non-volatile memory devices may retain their stored data even when their power supplies are interrupted. For example, the non-volatile memory devices may include read only memory (ROM), programmable ROM (PROM), erasable PROM (EPROM), electrically EPROM (EEPROM), and a flash memory device.

In addition, next-generation semiconductor memory devices (e.g., magnetic random access memory (MRAM) devices and phase-change random access memory (PRAM) devices) have been developed to provide high-performance and low power consumption semiconductor memory devices. Materials of these next-generation semiconductor memory devices may have resistance values variable according to currents or voltages applied thereto, and may retain their resistance values even when currents or voltages are interrupted.

SUMMARY

In an aspect, a variable resistance memory device may include a plurality of memory cell structures spaced apart from each other in a first direction and a second direction on a substrate, the first and second directions being parallel to a top surface of the substrate and intersecting each other, and a dummy cell structure surrounding each of the plurality of memory cell structures in a plan view and extending between the plurality of memory cell structures to form one body. Each of the plurality of memory cell structures may include first conductive lines, second conductive lines disposed on the first conductive lines and intersecting the first conductive lines, and memory cells between the first conductive lines and the second conductive lines. The dummy cell structure may include first dummy conductive lines, second dummy conductive lines disposed on the first dummy conductive lines and intersecting the first dummy conductive lines, and dummy memory cells between the first dummy conductive lines and the second dummy conductive lines.

In another aspect, a variable resistance memory device may include a plurality of memory cell structures spaced apart from each other in a first direction and a second direction on a substrate, the first and second directions being parallel to a top surface of the substrate and intersecting each other, and a single dummy cell structure disposed between the plurality of memory cell structures. The single dummy cell structure may extend between memory cell structures, spaced apart from each other in the first direction, of the plurality of memory cell structures and between memory cell structures, spaced apart from each other in the second direction, of the plurality of memory cell structures. Each of the plurality of memory cell structures may include first conductive lines, second conductive lines disposed on the first conductive lines and intersecting the first conductive lines, and memory cells between the first conductive lines and the second conductive lines. The single dummy cell structure may include first dummy conductive lines, second dummy conductive lines disposed on the first dummy conductive lines and intersecting the first dummy conductive lines, and dummy memory cells between the first dummy conductive lines and the second dummy conductive lines.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
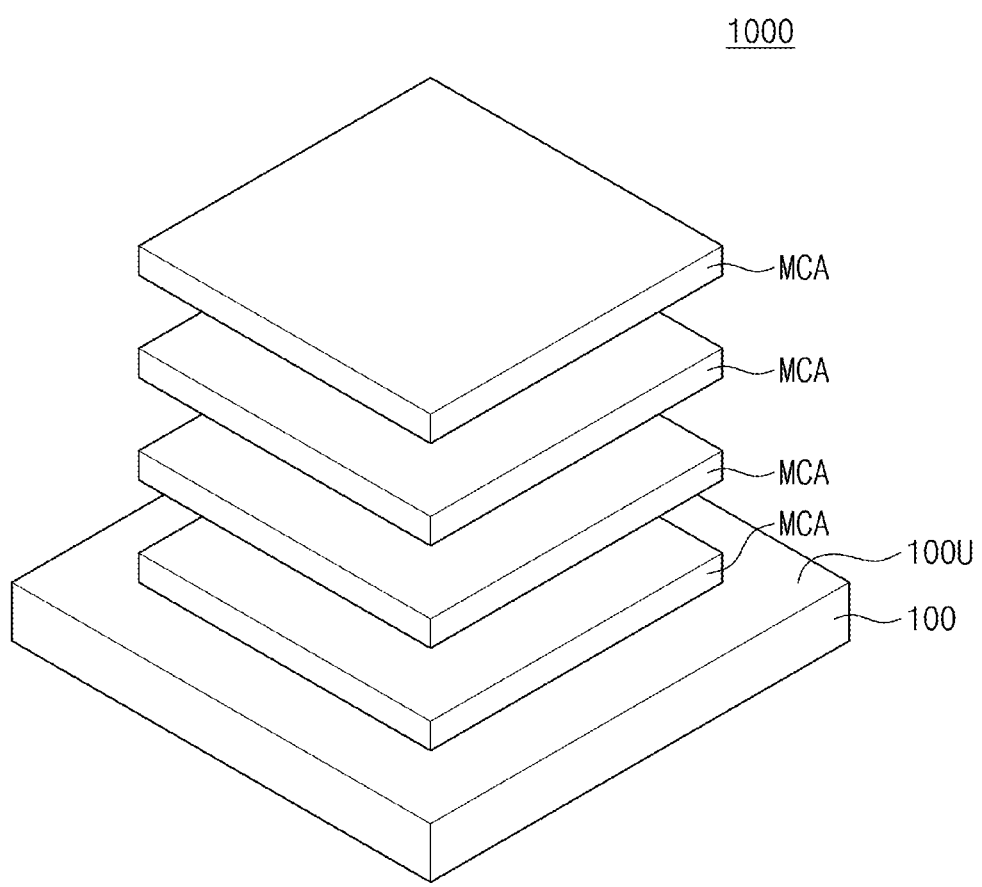
FIG. 1 is a conceptual view of a variable resistance memory device according to some embodiments.

FIG. 1 is a conceptual view of a variable resistance memory device according to some embodiments.

Referring to FIG. 1, a variable resistance memory device 1000 may include a plurality of memory cell arrays MCA sequentially stacked on a substrate 100. Each of the plurality of memory cell arrays MCA may include a plurality of memory cells two-dimensionally arranged in directions parallel to a top surface 100U of the substrate 100. The variable resistance memory device 1000 may further include a plurality of conductive layers, and the conductive layers and the memory cell arrays MCA may be alternately stacked on the substrate 100. Each of the plurality of memory cell arrays MCA may be disposed between the conductive layers vertically adjacent to each other. Each of the conductive layers may include a plurality of conductive lines for write, read and erase operations of the plurality of memory cells. Four memory cell arrays MCA are illustrated in FIG. 1. However, embodiments are not limited thereto.

Figure 2:
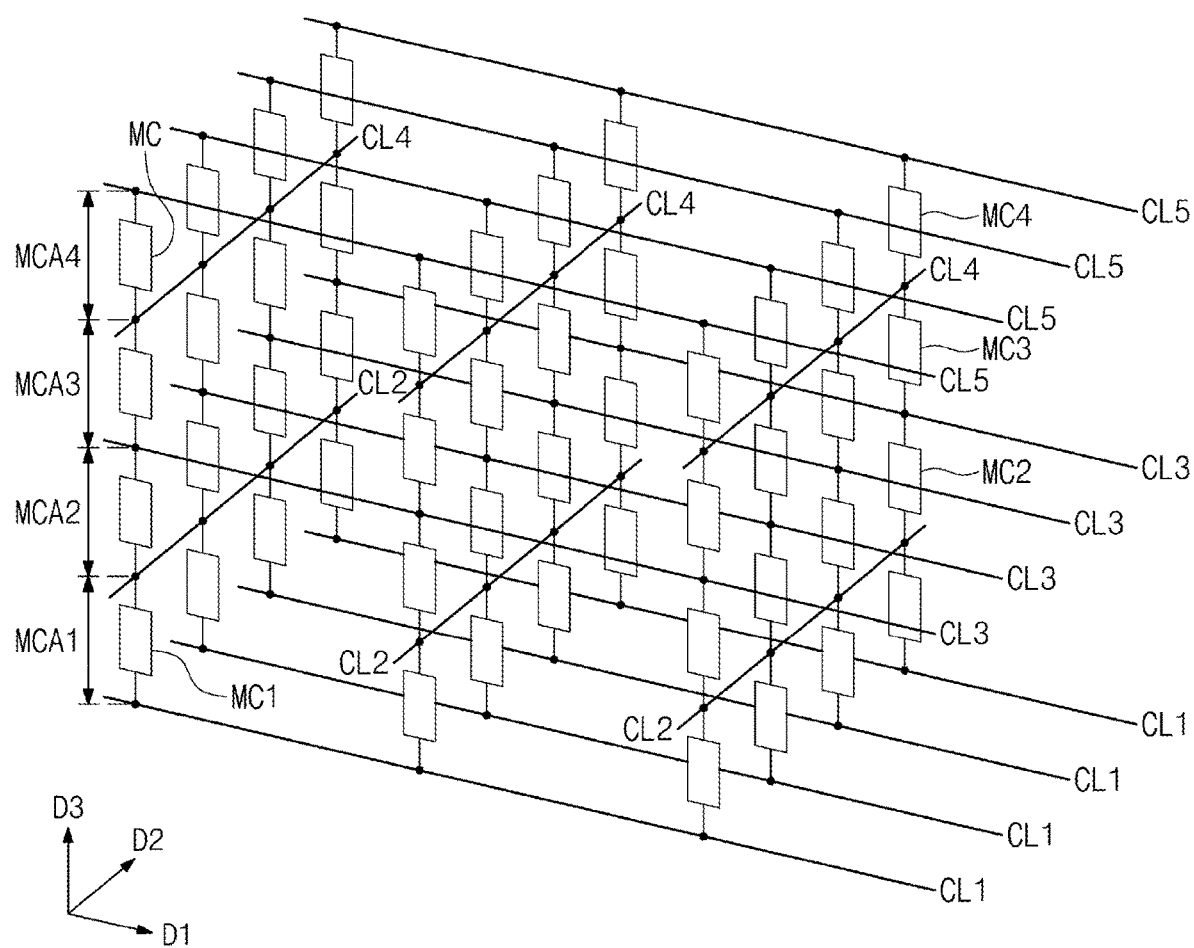
FIG. 2 is a circuit diagram of memory cell arrays of FIG. 1.

FIG. 2 is a circuit diagram of the memory cell arrays MCA of FIG. 1.

Referring to FIG. 2, the memory cell arrays MCA of FIG. 1 may include a first memory cell array MCA1, a second memory cell array MCA2, a third memory cell array MCA3, and a fourth memory cell array MCA4.

The first memory cell array MCA1 may be disposed between first conductive lines CL1 and second conductive lines CL2, and the second conductive lines CL2 may intersect the first conductive lines CL1. The first memory cell array MCA1 may include first memory cells MC1 which are disposed at intersection points of the first conductive lines CL1 and the second conductive lines CL2, respectively. Each of the first memory cells MC1 may include a first variable resistance pattern and a first switching pattern, which are connected in series to each other between a corresponding one of the first conductive lines CL1 and a corresponding one of the second conductive lines CL2.

The second memory cell array MCA2 may be disposed between the second conductive lines CL2 and third conductive lines CL3, and the third conductive lines CL3 may intersect the second conductive lines CL2. The second memory cell array MCA2 may include second memory cells MC2 which are disposed at intersection points of the second conductive lines CL2 and the third conductive lines CL3, respectively. Each of the second memory cells MC2 may include a second variable resistance pattern and a second switching pattern, which are connected in series to each other between a corresponding one of the second conductive lines CL2 and a corresponding one of the third conductive lines CL3. In some embodiments, the first memory cell array MCA1 and the second memory cell array MCA2 may share the second conductive lines CL2.

The third memory cell array MCA3 may be disposed between the third conductive lines CL3 and fourth conductive lines CL4, and the fourth conductive lines CL4 may intersect the third conductive lines CL3. The third memory cell array MCA3 may include third memory cells MC3 which are disposed at intersection points of the third conductive lines CL3 and the fourth conductive lines CL4, respectively. Each of the third memory cells MC3 may include a third variable resistance pattern and a third switching pattern, which are connected in series to each other between a corresponding one of the third conductive lines CL3 and a corresponding one of the fourth conductive lines CL4. In some embodiments, the second memory cell array MCA2 and the third memory cell array MCA3 may share the third conductive lines CL3.

The fourth memory cell array MCA4 may be disposed between the fourth conductive lines CL4 and fifth conductive lines CL5, and the fifth conductive lines CL5 may intersect the fourth conductive lines CL4. The fourth memory cell array MCA4 may include fourth memory cells MC4 which are disposed at intersection points of the fourth conductive lines CL4 and the fifth conductive lines CL5, respectively. Each of the fourth memory cells MC4 may include a fourth variable resistance pattern and a fourth switching pattern, which are connected in series to each other between a corresponding one of the fourth conductive lines CL4 and a corresponding one of the fifth conductive lines CL5. In some embodiments, the third memory cell array MCA3 and the fourth memory cell array MCA4 may share the fourth conductive lines CL4.

The first to fourth memory cell arrays MCA1, MCA2, MCA3 and MCA4 are illustrated in FIG. 2. However, embodiments are not limited thereto. Additional memory cell arrays and additional conductive lines may be stacked on the fourth memory cell array MCA4. The additional memory cell arrays may be substantially the same as the first to fourth memory cell arrays MCA1, MCA2, MCA3 and MCA4, and the additional conductive lines may be substantially the same as the first to fifth conductive lines CL1, CL2, CL3, CL4 and CL5.

Figure 3:
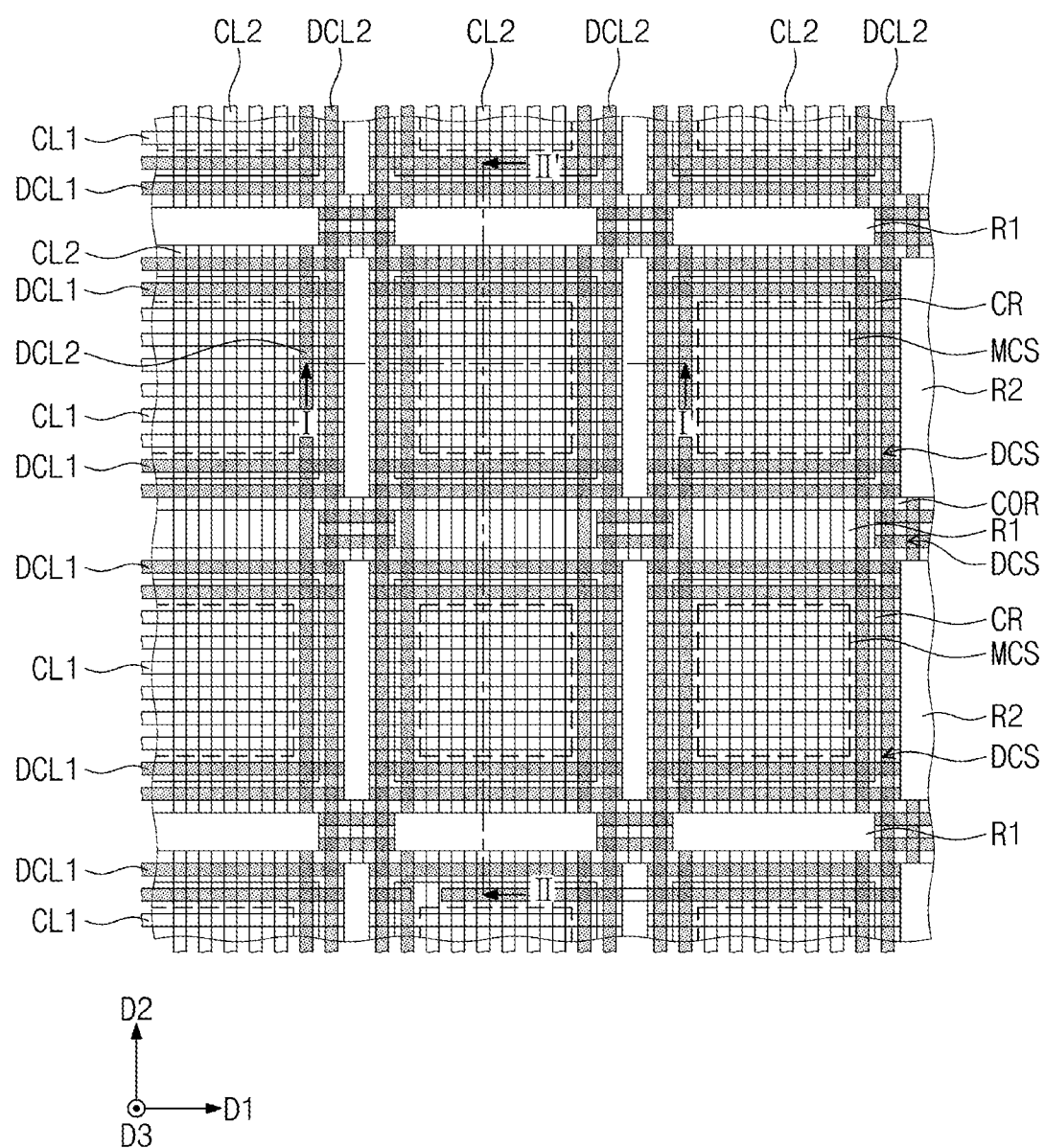
FIG. 3 is a plan view of a variable resistance memory device according to some embodiments.
Figure 4:
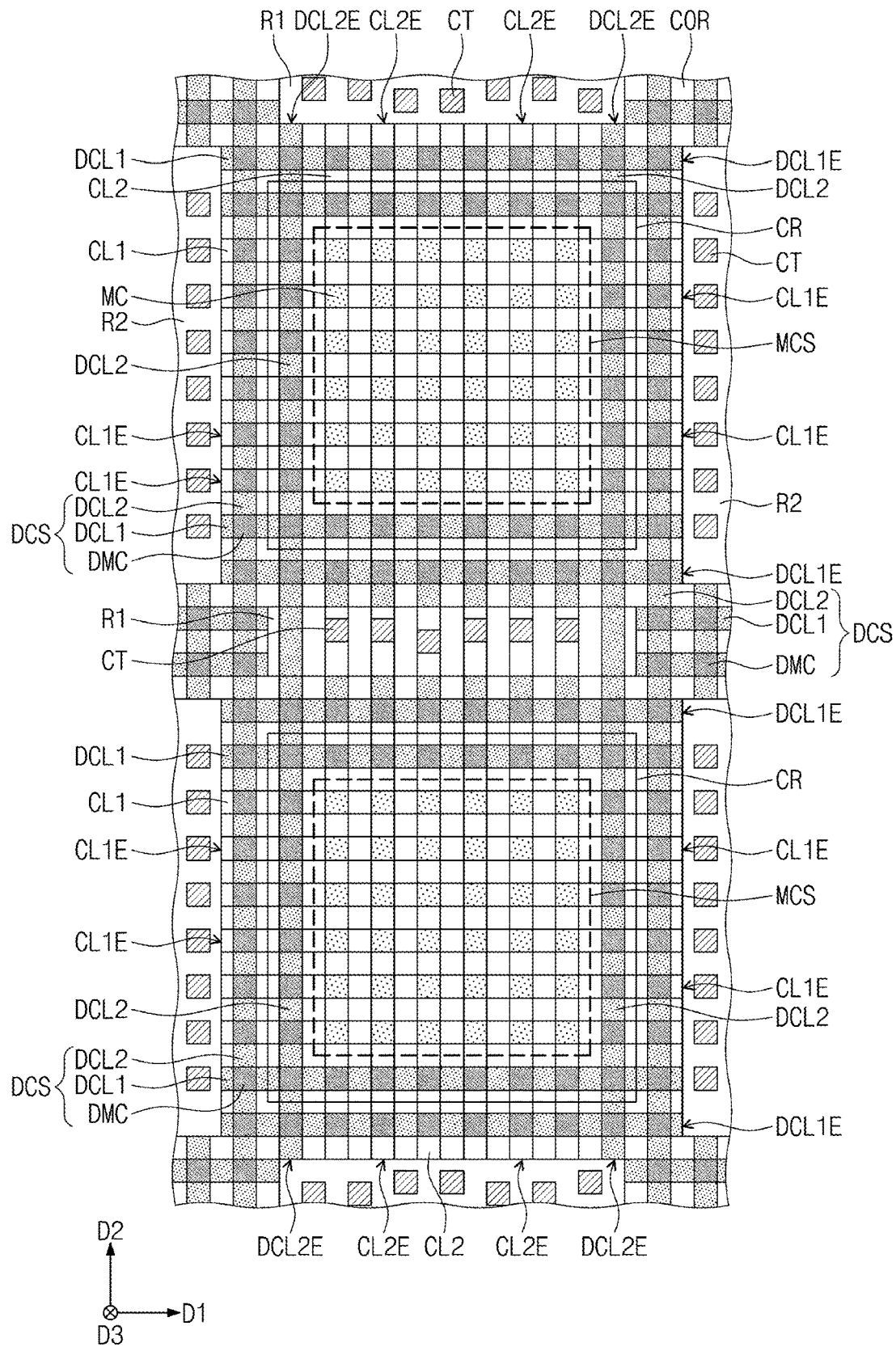
FIG. 4 is an enlarged view of a portion of the variable resistance memory device of FIG. 3.
Figure 5A:
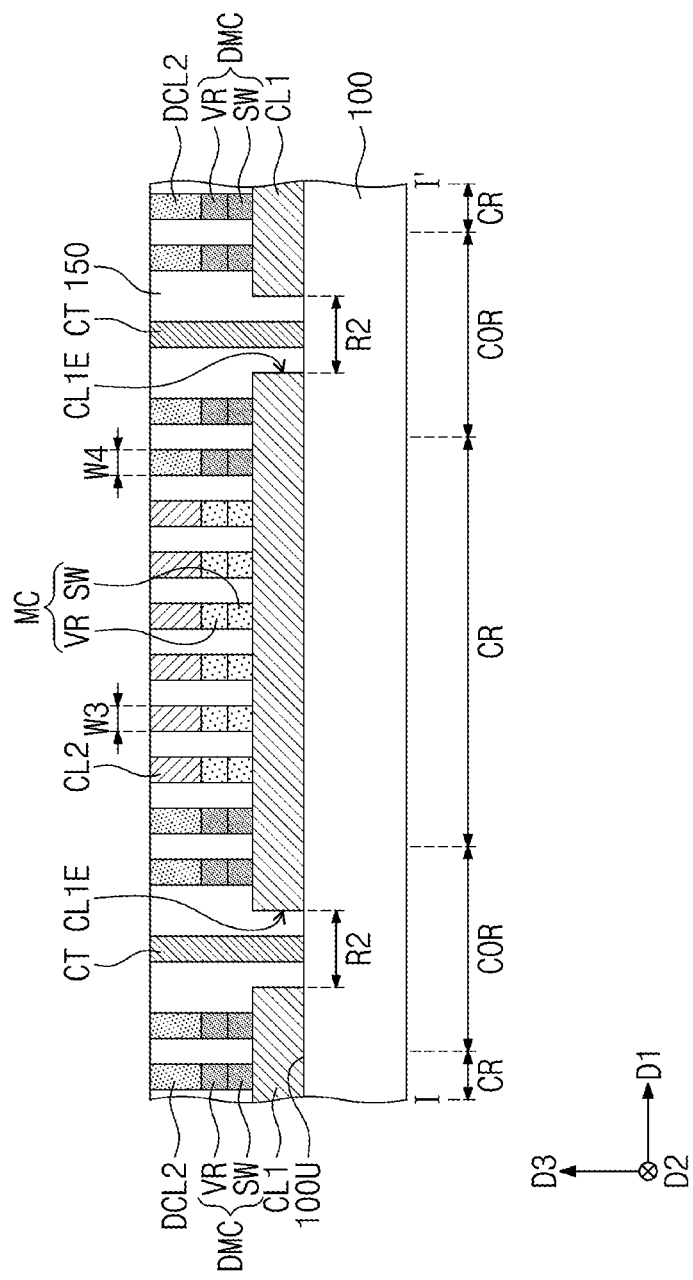
FIGS. 5A and 5B are cross-sectional views along lines I-I' and II-II' of FIG. 3, respectively.
Figure 5B:
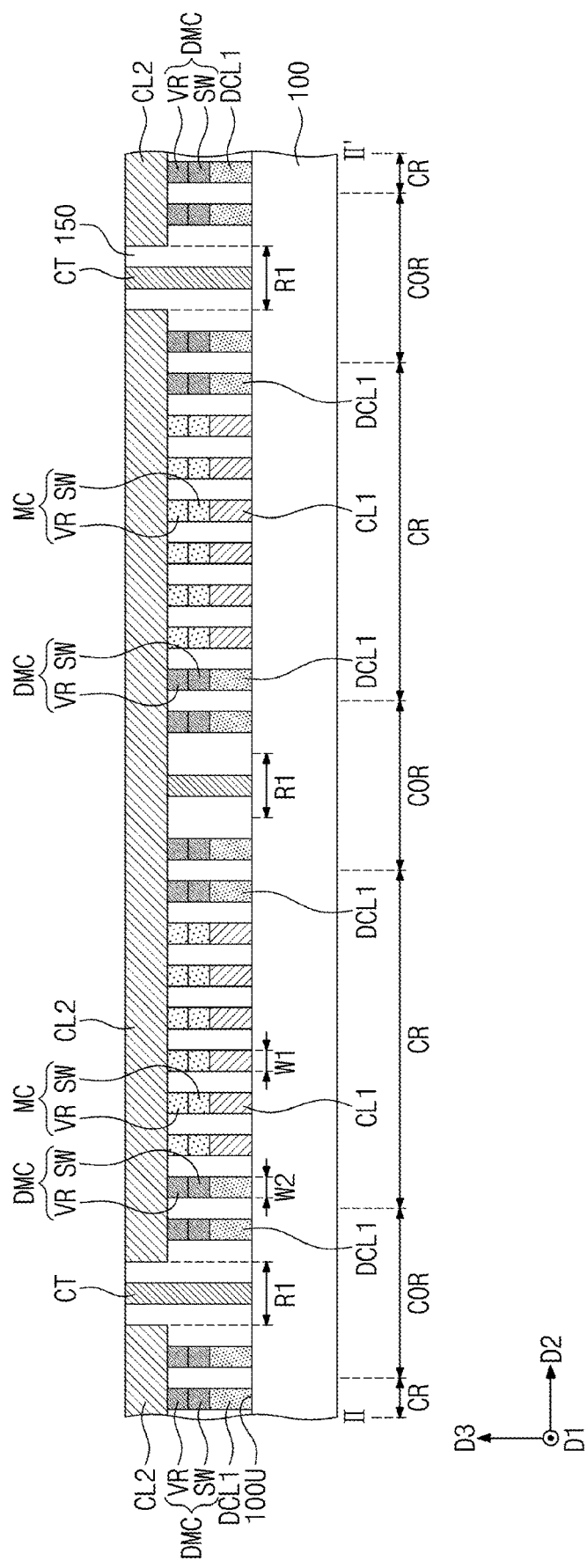

FIG. 3 is a plan view of a variable resistance memory device according to some embodiments. FIG. 4 is an enlarged view of a portion of the variable resistance memory device of FIG. 3. FIGS. 5A and 5B are cross-sectional views taken along lines I-I' and II-II' of FIG. 3, respectively. In the present embodiments, one memory cell array MCA will be mainly described for the purpose of ease and convenience in explanation.

Referring to FIGS. 3, 4, 5A and 5B, a substrate 100 including a plurality of cell regions CR and a core region COR between the plurality of cell regions CR may be provided. The substrate 100 may be a semiconductor substrate, e.g., a silicon substrate or a silicon-on-insulator (SOI) substrate. The plurality of cell regions CR may be arranged in first and second directions D1 and D2 parallel to a top surface 100U of the substrate 100, and the first direction D1 and the second direction D2 may intersect each other. The core region COR may extend in the first direction D1 and the second direction D2 between the plurality of cell regions CR and may surround each of the plurality of cell regions CR when viewed in a plan view, e.g., the core region COR may be a single grid-shaped structure continuously extending in the first and second directions D1 and D2 among all the cell regions CR to separate every two adjacent cell regions CR from each other.

A plurality of memory cell structures MCS may be disposed on the plurality of cell regions CR, respectively. The plurality of memory cell structures MCS may be spaced apart from each other in the first direction D1 and the second direction D2. Each of the plurality of memory cell structures MC S may include first conductive lines CL1, second conductive lines CL2 disposed on the first conductive lines CL1 and intersecting the first conductive lines CL1, and memory cells MC between the first conductive lines CL1 and the second conductive lines CL2. The first conductive lines CL1 may extend, e.g., lengthwise, in the first direction D1 and may be spaced apart from each other in the second direction D2. The second conductive lines CL2 may extend, e.g., lengthwise, in the second direction D2 and may be spaced apart from each other in the first direction D1. The memory cells MC may be disposed at intersection points of the first conductive lines CL1 and the second conductive lines CL2, respectively. Each of the memory cells MC may include a switching pattern SW and a variable resistance pattern VR, which are stacked in a third direction D3 perpendicular to the top surface 100U of the substrate 100. In some embodiments, the switching pattern SW may be disposed under the variable resistance pattern VR. However, embodiments are not limited thereto, e.g., the variable resistance pattern VR may be disposed under the switching pattern SW.

According to some embodiments, the first conductive lines CL1 may extend from each of the plurality of cell regions CR onto the core region COR in the first direction D1. Ends CL1E of the first conductive lines CL1 may be aligned with each other in the second direction D2 on the core region COR. The second conductive lines CL2 may extend from each of the plurality of cell regions CR onto the core region COR in the second direction D2. Ends CL2E of the second conductive lines CL2 may be aligned with each other in the first direction D1 on the core region COR.

The plurality of memory cell structures MCS may include a pair of memory cell structures MCS adjacent to each other in the second direction D2. The pair of memory cell structures MCS may be respectively disposed on a pair of cell regions CR, adjacent to each other in the second direction D2, of the plurality of cell regions CR. In some embodiments, the pair of memory cell structures MCS may share the second conductive lines CL2. In this case, the second conductive lines CL2 may, e.g., continuously, extend from one of the pair of cell regions CR onto the core region COR provided between the pair of cell regions CR, and may, e.g., continuously, extend onto the other of the pair of cell regions CR across the core region COR provided between the pair of cell regions CR.

As illustrated in FIG. 3, a dummy cell structure DCS may be disposed on the core region COR. The dummy cell structure DCS may surround each of the plurality of memory cell structures MCS in a plan view, and may extend between the plurality of memory cell structures MCS to form one, e.g., continuous, body. The dummy cell structure DCS may have a single body structure, e.g., a single and continuous structure that extends continuously along the core region COR to be adjacent to each one of the plurality of cell structures MCS, disposed between the plurality of memory cell structures MCS. The single dummy cell structure DCS may extend between a first pair of the memory cell structures MCS spaced apart from each other in the first direction D1 and between a second pair of the memory cell structures MCS spaced apart from each other in the first direction D1, and may extend between a third pair of the memory cell structures MCS spaced apart from each other in the second direction D2 and between a fourth pair of the memory cell structures MCS spaced apart from each other in the second direction D2. In other words, as illustrated in FIG. 3, the same single dummy cell structure DCS (gray-colored area in FIG. 3) may, e.g., continuously, extend between the first pair of the memory cell structures MCS spaced apart from each other in the first direction D1 and between the second pair of the memory cell structures MCS spaced apart from each other in the first direction D1, and may extend between the third pair of the memory cell structures MCS spaced apart from each other in the second direction D2 and between the fourth pair of the memory cell structures MCS spaced apart from each other in the second direction D2. The single dummy cell structure DCS may surround each of the plurality of memory cell structures MCS when viewed in a plan view.

The dummy cell structure DCS may include first dummy conductive lines DCL1, second dummy conductive lines DCL2 disposed on the first dummy conductive lines DCL1 and intersecting the first dummy conductive lines DCL1, and dummy memory cells DMC between the first dummy conductive lines DCL1 and the second dummy conductive lines DCL2. It is noted that the term "dummy" refers to a configuration having a structure and shape identical or similar to other components, but not practically, e.g., electrically, functioning inside the variable resistance memory device 1000. Thus, an electrical signal is not applied to a "dummy" component, or the "dummy" component does not perform an electrically specific function.

The first dummy conductive lines DCL1 may extend, e.g., lengthwise, in the first direction D1 and may be spaced apart from each other in the second direction D2. Each of the plurality of memory cell structures MCS (in the core region CR) may be disposed between a pair of first dummy conductive lines DCL1 that is spaced apart from each other in the second direction D2. The first dummy conductive lines DCL1 may be disposed on the core region COR. Some of the first dummy conductive lines DCL1 may intersect edges of each of the plurality of cell regions CR and may extend onto the core region COR. In some embodiments, ends DCL1E of first dummy conductive lines DCL1, adjacent to the first conductive lines CL1, of the first dummy conductive lines DCL1 may be aligned with the ends CL1E of the first conductive lines CL1 in the second direction D2 on the core region COR.

The first conductive lines CL1 and the first dummy conductive lines DCL1 may have widths in the second direction D2, e.g., lengths of the first conductive lines CL1 and the first dummy conductive lines DCL1 in the first direction D1 may be longer than respective widths thereof in the second direction D2. In some embodiments, a first width W1 of each of the first conductive lines CL1 may be equal to a second width W2 of each of the first dummy conductive lines DCL1. The first dummy conductive lines DCL1 may include the same material as the first conductive lines CL1. For example, the first dummy conductive lines DCL1 and the first conductive lines CL1 may include at least one of a doped semiconductor material (e.g., doped silicon), a metal (e.g., tungsten, aluminum, titanium, or tantalum), a conductive metal nitride (e.g., titanium nitride, tantalum nitride, or tungsten nitride), or a metal-semiconductor compound (e.g., a metal silicide). The first dummy conductive lines DCL1 may be electrically floated. For example, the first conductive lines CL1 and the first dummy conductive lines DCL1 may include the same material, have a same size, and be spaced at equal intervals, with the exception that the first dummy conductive lines DCL1 are electrically floated.

The second dummy conductive lines DCL2 may extend, e.g., lengthwise, in the second direction D2 and may be spaced apart from each other in the first direction D1. Each of the plurality of memory cell structures MCS (in the core region CR) may be disposed between a pair of second dummy conductive lines DCL2 that is spaced apart from each other in the first direction D1. The second dummy conductive lines DCL2 may be disposed on the core region COR. Some of the second dummy conductive lines DCL2 may intersect edges of each of the plurality of cell regions CR and may extend onto the core region COR. In some embodiments, ends DCL2E of second dummy conductive lines DCL2, adjacent to the second conductive lines CL2, of the second dummy conductive lines DCL2 may be aligned with the ends CL2E of the second conductive lines CL2 in the first direction D1 on the core region COR. For example, as illustrated in FIGS. 3 and 4, some of the second dummy conductive lines DCL2 may extend continuously along a plurality of cell regions CR arranged in a column along the second direction D2.

The second conductive lines CL2 and the second dummy conductive lines DCL2 may have widths in the first direction D1, e.g., lengths of the second conductive lines CL2 and the second dummy conductive lines DCL2 in the second direction D2 may be longer than respective widths thereof in the first direction D1. In some embodiments, a third width W3 of each of the second conductive lines CL2 may be equal to a fourth width W4 of each of the second dummy conductive lines DCL2. The second dummy conductive lines DCL2 may include the same material as the second conductive lines CL2. For example, the second dummy conductive lines DCL2 and the second conductive lines CL2 may include at least one of a doped semiconductor material (e.g., doped silicon), a metal (e.g., tungsten, aluminum, titanium, or tantalum), a conductive metal nitride (e.g., titanium nitride, tantalum nitride, or tungsten nitride), or a metal-semiconductor compound (e.g., a metal silicide). The second dummy conductive lines DCL2 may be electrically floated. For example, the second conductive lines CL2 and the second dummy conductive lines DCL2 may include the same material, have a same size, and be spaced at equal intervals, with the exception that the second dummy conductive lines DCL2 are electrically floated.

In some embodiments, the second dummy conductive lines DCL2 may intersect the first dummy conductive lines DCL1 and the first conductive lines CL1, and the second conductive lines CL2 may intersect the first dummy conductive lines DCL1 and the first conductive lines CL1. The dummy memory cells DMC may be disposed at intersection points of the second dummy conductive lines DCL2 and the first dummy conductive lines DCL1, intersection points of the second dummy conductive lines DCL2 and the first conductive lines CL1 and intersection points of the second conductive lines CL2 and the first dummy conductive lines DCL1, respectively. The dummy memory cells DMC may have the same components as the memory cells MC. Each of the dummy memory cells DMC may include the switching pattern SW and the variable resistance pattern VR, which are stacked in the third direction D3.

The dummy memory cells DMC may be arranged to surround each of the plurality of memory cell structures MCS in a plan view, and may be two-dimensionally arranged on the core region COR between the plurality of memory cell structures MCS. For example, as illustrated in FIGS. 3 and 4, the dummy memory cells DMC may be arranged to surround each of the cell regions CR, i.e., around a perimeter of each of the memory cell structures MCS (indicated with a dashed line in FIGS. 3 and 4), as viewed in a plan view. For example, as illustrated in FIGS. 3 and 4, the dummy memory cells DMC may be arranged two-dimensionally on the core region COR between adjacent ones of the memory cell structures MCS, e.g., between adjacent ones of the dashed structures of the cell regions CR. The dummy memory cells DMC may be connected to the first dummy conductive lines DCL1 and the second dummy conductive lines DCL2. The dummy memory cells DMC, the first dummy conductive lines DCL1, and the second dummy conductive lines DCL2 may be connected to each other to constitute the single dummy cell structure DCS.

As illustrated in FIG. 3, the core region COR may include first contact regions R1 and second contact regions R2. For example, each of the first contact regions R1 may be provided between the memory cell structures MCS spaced apart from each other in the second direction D2, and each of the second contact regions R2 may be provided between the memory cell structures MCS spaced apart from each other in the first direction D1. As illustrated in FIG. 4, conductive contacts CT may be disposed on the first and second contact regions R1 and R2, and may be electrically connected to transistors on the substrate 100. The conductive contacts CT may include a conductive material. In some embodiments, when a pair of the memory cell structures MCS adjacent to each other in the second direction D2 share the second conductive lines CL2, the second conductive lines CL2 may be respectively connected to the conductive contacts CT on the first contact region R1 between the pair of memory cell structures MCS.

The dummy cell structure DCS may be disposed on the core region COR except the first and second contact regions R1 and R2. The dummy cell structure DCS may extend along the core region COR except the first and second contact regions R1 and R2 to form one body. For example, as illustrated in FIG. 4, the dummy cell structure DCS may be on and overlap the core region COR, as viewed in a plan view, except the first and second contact regions R1 and R2, e.g., the dummy cell structure DCS may have a non-overlapping relationship with the first and second contact regions R1 and R2 in a plan view.

As illustrated in FIGS. 5A and 5B, an interlayer insulating layer 150 may be disposed on the substrate 100 and may cover the plurality of memory cell structures MCS and the dummy cell structure DCS. For example, the interlayer insulating layer 150 may cover sidewalls of the first conductive lines CL1, sidewalls of the first dummy conductive lines DCL1, sidewalls of the memory cells MC, sidewalls of the dummy memory cells DMC, sidewalls of the second conductive lines CL2, and sidewalls of the second dummy conductive lines DCL2. The conductive contacts CT may penetrate the interlayer insulating layer 150 so as to be electrically connected to the transistors of the substrate 100. For example, the interlayer insulating layer 150 may include at least one of silicon oxide, silicon nitride, or silicon oxynitride.

For example, if the memory cell structures MCS were to be formed without the dummy cell structure DCS, outermost memory cells MC of each of the plurality of memory cell structures MCS would have been vulnerable in a manufacturing process (e.g., a step difference between the cell region CR and the core region COR after a planarization process, an etch loading effect between the cell region CR and the core region COR during an etching process, etc.) by a difference in pattern density between each of the plurality of cell regions CR and the core region COR. Thus, operating failure of the outermost memory cells MC could have been caused.

However, according to embodiments, the dummy cell structure DCS may be disposed on the core region COR to surround each of the plurality of memory cell structures MCS, and may extend along the core region COR between the plurality of memory cell structures MCS to form one body. The dummy cell structure DCS may have the same stack structure as the plurality of memory cell structures MCS. In other words, the dummy cell structure DCS may include the first dummy conductive lines DCL1, the second dummy conductive lines DCL2 intersecting the first dummy conductive lines DCL1, and the dummy memory cells DMC between the first dummy conductive lines DCL1 and the second dummy conductive lines DCL2. In this case, a difference in pattern density between each of the cell regions CR and the core region COR may be minimized, and thus it is possible to inhibit or prevent defects of the outermost memory cells MC of each of the memory cell structures MCS from occurring in a manufacturing process. In addition, since the dummy cell structure DCS is formed to have the same stack structure as the plurality of memory cell structures MCS, it may be easy to form the plurality of memory cell structures MCS and the dummy cell structure DCS. As a result, it is possible to realize or provide the variable resistance memory device capable of minimizing defects of memory cells and of being easily manufactured.

Figure 6:
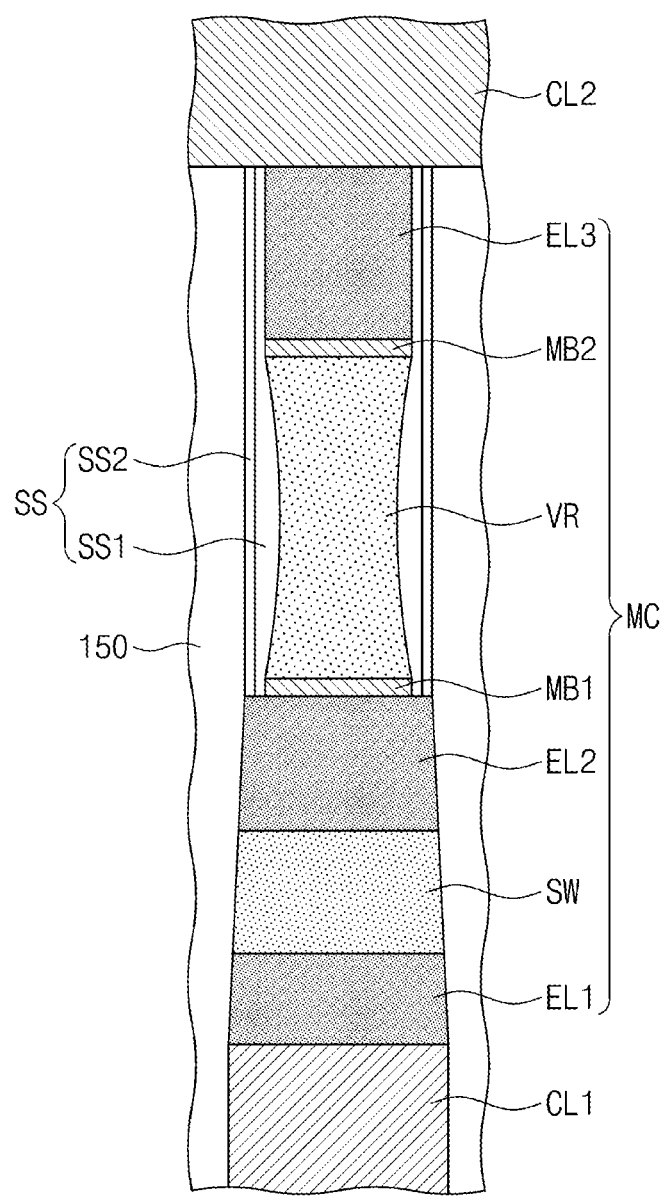
FIG. 6 is a cross-sectional view of a memory cell according to some embodiments.
Figure 7A:
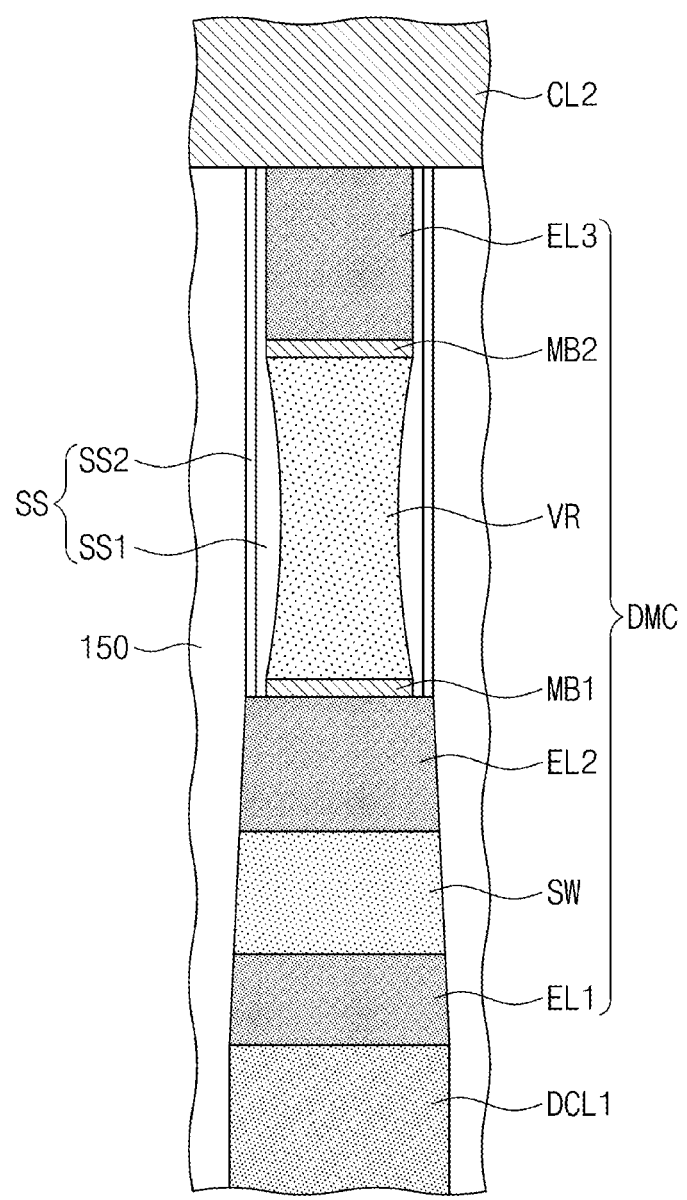
FIGS. 7A to 7C are cross-sectional views of dummy memory cells according to some embodiments.
Figure 7B:
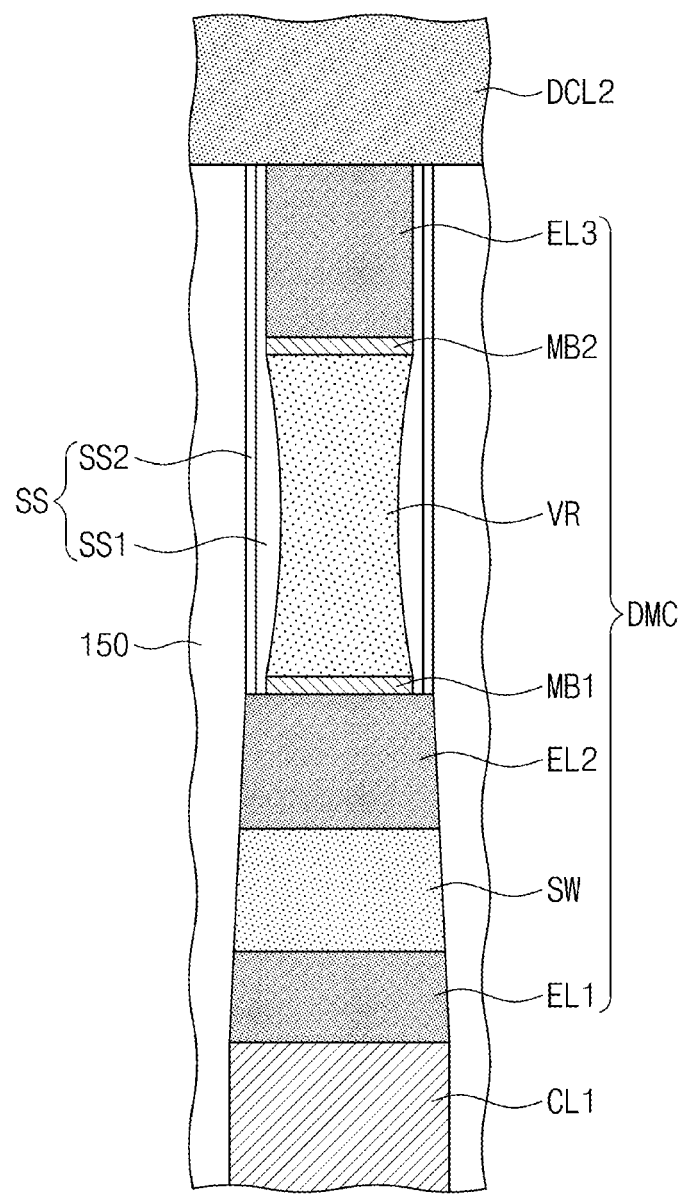
Figure 7C:
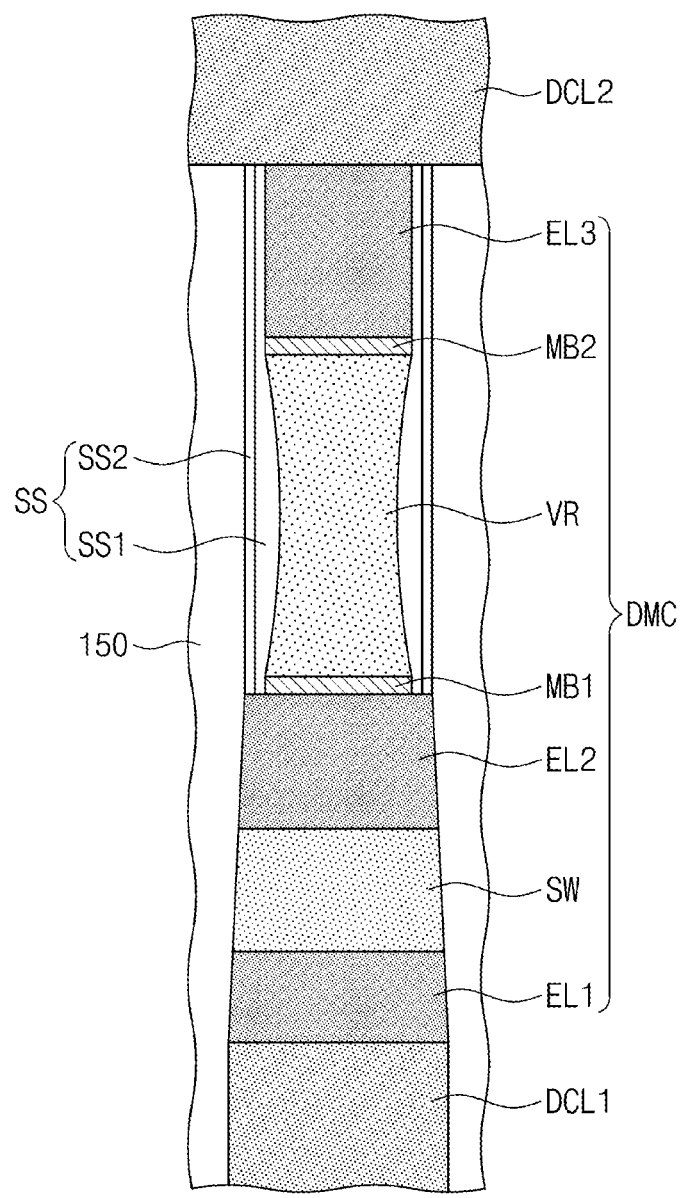

FIG. 6 is a cross-sectional view illustrating a memory cell according to some embodiments. FIGS. 7A to 7C are cross-sectional views illustrating dummy memory cells according to some embodiments.

Referring to FIG. 6, each of the memory cells MC may be disposed between a corresponding one of the first conductive lines CL1 and a corresponding one of the second conductive lines CL2. Each of the memory cells MC may include a variable resistance pattern VR and a switching pattern SW, which are connected in series to each other between the corresponding first conductive line CL1 and the corresponding second conductive line CL2. Each of the memory cells MC may further include a first electrode pattern EL1 between the corresponding first conductive line CL1 and the switching pattern SW, a second electrode pattern EL2 between the switching pattern SW and the variable resistance pattern VR, a third electrode pattern EL3 between the variable resistance pattern VR and the corresponding second conductive line CL2, a first metal pattern MB1 between the variable resistance pattern VR and the second electrode pattern EL2, and a second metal pattern MB2 between the variable resistance pattern VR and the third electrode pattern EL3.

The first to third electrode patterns EL1, EL2 and EL3 may include a conductive material. For example, the first to third electrode patterns EL1, EL2 and EL3 may be carbon electrodes including carbon. In certain embodiments, the first to third electrode patterns EL1, EL2 and EL3 may include a metal and/or a metal nitride. The first metal pattern MB1 and the second metal pattern MB2 may cover a bottom surface and a top surface, e.g., entire bottom and top surfaces, of the variable resistance pattern VR to prevent diffusion of a material of the variable resistance pattern VR. In addition, the first metal pattern MB1 may be provided between the variable resistance pattern VR and the switching pattern SW to improve a contact resistance. For example, the first and second metal patterns MB1 and MB2 may include at least one of W, Ti, Al, Cu, C, CN, TiN, TiAlN, TiSiN, TiCN, WN, CoSiN, WSiN, TaN, TaCN, or TaSiN.

The variable resistance pattern VR may include a material capable of storing data using its resistance change. In some embodiments, the variable resistance pattern VR may include a material of which a phase is reversibly changeable between a crystalline state and an amorphous state by a temperature. For example, the variable resistance pattern VR may include a compound which includes at least one of Te or Se (i.e., chalcogen elements) and at least one of Ge, Sb, Bi, Pb, Sn, Ag, As, S, Si, In, or Ga.

For some examples, the variable resistance pattern VR may include at least one of GeTe, GeSe, GeS, SbSe, SbTe, SbS, SbSe, SnSb, InSe, InSb, AsTe, AlTe, GaSb, AlSb, BiSb, ScSb, YSb, CeSb, DySb, or NdSb. For some examples, the variable resistance pattern VR may include at least one of GeSbSe, AlSbTe, AlSbSe, SiSbSe, SiSbTe, GeSeTe, InGeTe, GeSbTe, GeAsTe, SnSeTe, GeGaSe, BiSbSe, GaSeTe, InGeSb, GaSbSe, GaSbTe, InSbSe, InSbTe, SnSbSe, SnSbTe, ScSbTe, ScSbSe, ScSbS, YSbTe, YSbSe, YSbS, CeSbTe, CeSbSe, CeSbS, DySbTe, DySbSe, DySbS, NdSbTe, NdSbSe, or NdSbS. For some examples, the variable resistance pattern VR may include at least one of GeSbTeS, BiSbTeSe, AgInSbTe, GeSbSeTe, GeSnSbTe, SiGeSbTe, SiGeSbSe, SiGeSeTe, BiGeSeTe, BiSiGeSe, BiSiGeTe, GeSbTeBi, GeSbSeBi, GeSbSeIn, GeSbSeGa, GeSbSeAl, GeSbSeTl, GeSbSeSn, GeSbSeZn, GeSbTeIn, GeSbTeGa, GeSbTeAl, GeSbTeTl, GeSbTeSn, GeSbTeZn, ScGeSbTe, ScGeSbSe, ScGeSbS, YGeSbTe, YGeSbSe, YGeSbS, CeGeSbTe, CeGeSbSe, CeGeSbS, DyGeSbTe, DyGeSbSe, DyGeSbS, NdGeSbTe, NdGeSbSe, or NdGeSbS. For some examples, the variable resistance pattern VR may include at least one of InSbTeAsSe, GeScSbSeTe, GeSbSeTeS, GeScSbSeS, GeScSbTeS, GeScSeTeS, GeScSbSeP, GeScSbTeP, GeSbSeTeP, GeScSbSeIn, GeScSbSeGa, GeScSbSeAl, GeScSbSeTl, GeScSbSeZn, GeScSbSeSn, GeScSbTeIn, GeScSbTeGa, GeSbAsTeAl, GeScSbTeTl, GeScSbTeZn, GeScSbTeSn, GeSbSeTeIn, GeSbSeTeGa, GeSbSeTeAl, GeSbSeTeTl, GeSbSeTeZn, GeSbSeTeSn, GeSbSeSIn, GeSbSeSGa, GeSbSeSAl, GeSbSeSTl, GeSbSeSZn, GeSbSeSSn, GeSbTeSIn, GeSbTeSGa, GeSbTeSAl, GeSbTeSTl, GeSbTeSZn, GeSbTeSSn, GeSbSeInGa, GeSbSeInAl, GeSbSeInTl, GeSbSeInZn, GeSbSeInSn, GeSbSeGaAl, GeSbSeGaTl, GeSbSeGaZn, GeSbSeGaSn, GeSbSeAlTl, GeSbSeAlZn, GeSb SeAl Sn, GeSbSeTlZn, GeSbSeTlSn, or GeSbSeZnSn. The variable resistance pattern VR may further include at least one of B, C, N, O, P, Cd, W, Ti, Hf, or Zr.

In some embodiments, the variable resistance pattern VR may have a single-layered structure or a multi-layered structure including a plurality of stacked layers. In certain embodiments, the variable resistance pattern VR may have a superlattice structure in which layers including Ge and layers not including Ge are repeatedly and alternately stacked. For example, the variable resistance pattern VR may have a structure in which GeTe layers and SbTe layers are repeatedly and alternately stacked.

In certain embodiments, the variable resistance pattern VR may include at least one of perovskite compounds or conductive metal oxides. For example, the variable resistance pattern VR may include at least one of niobium oxide, titanium oxide, nickel oxide, zirconium oxide, vanadium oxide, $(Pr,Ca)MnO_3$ (PCMO), strontium-titanium oxide, barium-strontium-titanium oxide, strontium-zirconium oxide, barium-zirconium oxide, or barium-strontium-zirconium oxide. When the variable resistance pattern VR includes a transition metal oxide, a dielectric constant of the variable resistance pattern VR may be greater than a dielectric constant of silicon oxide.

In certain embodiments, the variable resistance pattern VR may have a double-layer structure of a conductive metal oxide layer and a tunnel insulating layer or may have a triple-layer structure of a first conductive metal oxide layer, a tunnel insulating layer, and a second conductive metal oxide layer. In this case, the tunnel insulating layer may include, e.g., aluminum oxide, hafnium oxide, or silicon oxide.

In some embodiments, the switching pattern SW may include a silicon diode or an oxide diode, which has a rectifying property. In this case, the switching pattern SW may include a silicon diode of P-type silicon and N-type silicon or may include an oxide diode of P-type $NiO_x$ and N-type $TiO_x$ or an oxide diode of P-type $CuO_x$ and N-type $TiO_x$. In certain embodiments, the switching pattern SW may include an oxide (e.g., $ZnO_x$, $MgO_x$ $AlO_x$, etc.), which has a high resistance below a specific voltage to interrupt a current and has a low resistance at the specific voltage or higher to allow a current to flow.

In certain embodiments, the switching pattern SW may be an ovonic threshold switch (OTS) element having a bi-directional characteristic. In this case, the switching pattern SW may include a chalcogenide material in a substantially amorphous state. Here, the term 'substantially amorphous state' may include an amorphous state and may also include a case in which a grain boundary or a crystallized portion locally exists in a portion of a component. In this case, the switching pattern SW may include a compound which includes a chalcogen element (e.g., Te and/or Se) and at least one of Ge, Sb, Bi, Al, Pb, Sn, Ag, As, S, Si, In, Ti, Ga, or P.

For some examples, the switching pattern SW may include at least one of GeSe, GeS, AsSe, AsTe, AsS, SiTe, SiSe, SiS, GeAs, SiAs, SnSe, or SnTe. For some examples, the switching pattern SW may include at least one of GeAsTe, GeAsSe, AlAsTe, AlAsSe, SiAsSe, SiAsTe, GeSeTe, GeSeSb, GaAsSe, GaAsTe, InAsSe, InAsTe, SnAsSe, or SnAsTe. For some examples, the switching pattern SW may include at least one of GeSiAsTe, GeSiAsSe, GeSiSeTe, GeSeTeSb, GeSiSeSb, GeSiTeSb, GeSeTeBi, GeSiSeBi, GeSiTeBi, GeAsSeSb, GeAsTeSb, GeAsTeBi, GeAsSeBi, GeAsSeIn, GeAsSeGa, GeAsSeAl, GeAsSeTl, GeAsSeSn, GeAsSeZn, GeAsTeIn, GeAsTeGa, GeAsTeAl, GeAsTeTl, GeAsTeSn, or GeAsTeZn. For some examples, the switching pattern SW may include at least one of GeSiAsSeTe, GeAsSeTeS, GeSiAsSeS, GeSiAsTeS, GeSiSeTeS, GeSiAsSeP, GeSiAsTeP, GeAsSeTeP, GeSiAsSeIn, GeSiAsSeGa, GeSiAsSeAl, GeSiAsSeTl, GeSiAsSeZn, GeSiAsSeSn, GeSiAsTeIn, GeSiAsTeGa, GeSiAsTeAl, GeSiAsTeTl, GeSiAsTeZn, GeSiAsTeSn, GeAsSeTeIn, GeAsSeTeGa, GeAsSeTeAl, GeAsSeTeTl, GeAsSeTeZn, GeAsSeTeSn, GeAsSeSIn, GeAsSeSGa, GeAsSeSAl, GeAsSeSTl, GeAsSeSZn, GeAsSeSSn, GeAsTeSIn, GeAsTeSGa, GeAsTeSAl, GeAsTeSTl, GeAsTeSZn, GeAsTeSSn, GeAsSeInGa, GeAsSeInAl, GeAsSeInTl, GeAsSeInZn, GeAsSeZnSn, GeAsSeGaAl, GeAsSeGaTl, GeAsSeGaZn, GeAsSeGaSn, GeAsSeAlTl, GeAsSeAlZn, GeAsSEAlSn, GeAsSeTlZn, GeAsSeTlSn, or GeAsSeZnSn. For some examples, the switching pattern SW may include at least one of GeSiAsSeTeS, GeSiAsSeTeIn, GeSiAsSeTeGa, GeSiAsSeTeAl, GeSiAsSeTeTl, GeSiAsSeTeZn, GeSiAsSeTeSn, GeSiAsSeTeP, GeSiAsSeSIn, GeSiAsSeSGa, GeSiAsSeSAl, GeSiAsSeSTl, GeSiAsSeSZn, GeSiAsSeSSn, GeAsSeTeSIn, GeAsSeTeSGa, GeAsSeTeSAl, GeAsSeTeSTl, GeAsSeTeSZn, GeAsSeTeSSn, GeAsSeTePIn, GeAsSeTePGa, GeAsSeTePAl, GeAsSeTePTl, GeAsSeTePZn, GeAsSeTePSn, GeSiAsSeInGa, GeSiAsSeInAl, GeSiAsSeInTl, GeSiAsSeInZn, GeSiAsSeInSn, GeSiAsSeGaAl, GeSiAsSeGaTl, GeSiAsSeGaZn, GeSiAsSeGaSn, GeSiAsSeAlSn, GeAsSeTeInGa, GeAsSeTeInAl, GeAsSeTeInTl, GeAsSeTeInZn, GeAsSeTeInSn, GeAsSeTeGaAl, GeAsSeTeGaTl, GeAsSeTeGaZn, GeAsSeTeGaSn, GeAsSeTeAlSn, GeAsSeSInGa, GeAsSeSInAl, GeAsSeSInTl, GeAsSeSInZn, GeAsSeSInSn, GeAsSeSGaAl, GeAsSeSGaTl, GeAsSeSGaZn, GeAsSeSGaSn, or GeAsSeSAlSn. The switching pattern SW may further include at least one of B, C, N, or O. The switching pattern SW may have a single-layered structure or a multi-layered structure including a plurality of stacked layers.

Each of the memory cells MC may further include a spacer structure SS. The spacer structure SS may cover sidewalls of the first metal pattern MB1, the second metal pattern MB2, the variable resistance pattern VR, and the third electrode pattern EL3. A bottom surface of the spacer structure SS may be in contact with a top surface of the second electrode pattern EL2. The spacer structure SS may include at least one of a silicon oxide layer, a silicon nitride layer, and a silicon oxynitride layer. For example, the spacer structure SS may include a first spacer SS1 and a second spacer SS2, which include different materials. The first spacer SS1 may fill recess portions of the variable resistance pattern VR. The second spacer SS2 may cover a sidewall of the first spacer SS1.

Referring to FIGS. 7A to 7C, each of the dummy memory cells DMC may be disposed between a corresponding one of the first dummy conductive lines DCL1 and a corresponding one of the second conductive lines CL2, between a corresponding one of the first conductive lines CL1 and a corresponding one of the second dummy conductive lines DCL2, or between a corresponding one of the first dummy conductive lines DCL1 and a corresponding one of the second dummy conductive lines DCL2. Each of the dummy memory cells DMC may have the same components as each of the memory cells MC. Each of the dummy memory cells DMC may include the variable resistance pattern VR and the switching pattern SW, which are connected in series to each other. Each of the dummy memory cells DMC may further include the first electrode pattern EL1 between the corresponding first dummy conductive line DCL1 (or the corresponding first conductive line CL1) and the switching pattern SW, the second electrode pattern EL2 between the switching pattern SW and the variable resistance pattern VR, the third electrode pattern EL3 between the variable resistance pattern VR and the corresponding second dummy conductive line DCL2 (or the corresponding second conductive line CL2), the first metal pattern MB1 between the variable resistance pattern VR and the second electrode pattern EL2, and the second metal pattern MB2 between the variable resistance pattern VR and the third electrode pattern EL3. Each of the dummy memory cells DMC may further include the spacer structure SS, and the spacer structure SS may include the first spacer SS1 and the second spacer SS2 which include different materials.

The first to third electrode patterns ELL EL2 and EL3, the switching pattern SW, the variable resistance pattern VR, the first and second metal patterns MB1 and MB2, and the spacer structure SS of each of the dummy memory cells DMC may be the same as the first to third electrode patterns ELL EL2 and EL3, the switching pattern SW, the variable resistance pattern VR, the first and second metal patterns MB1 and MB2, and the spacer structure SS of each of the memory cells MC, respectively.

Figure 8A:
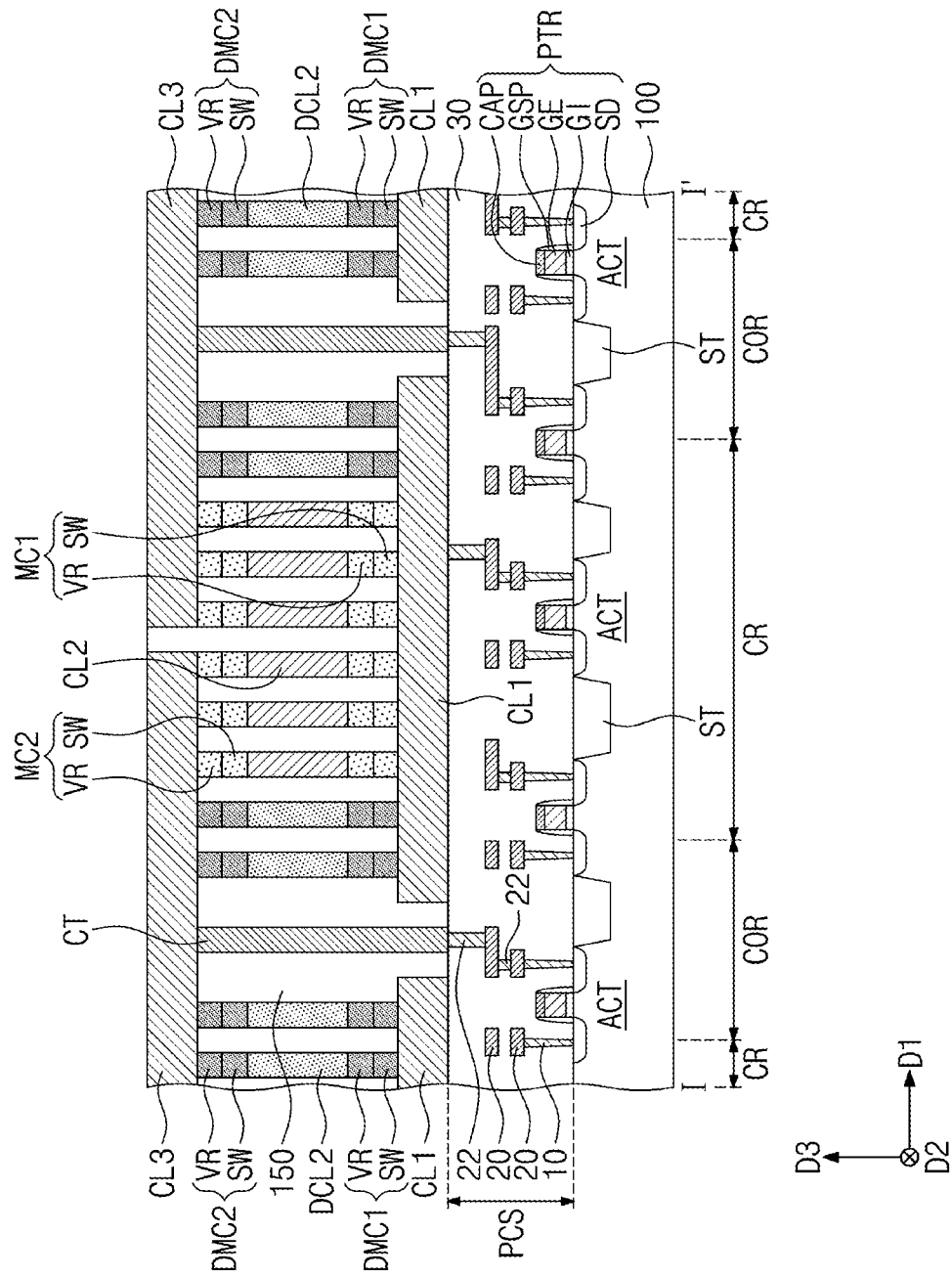
FIGS. 8A and 8B are cross-sectional views respectively corresponding to lines I-I' and II-II' of FIG. 3 to illustrate a variable resistance memory device according to some embodiments.
Figure 8B:
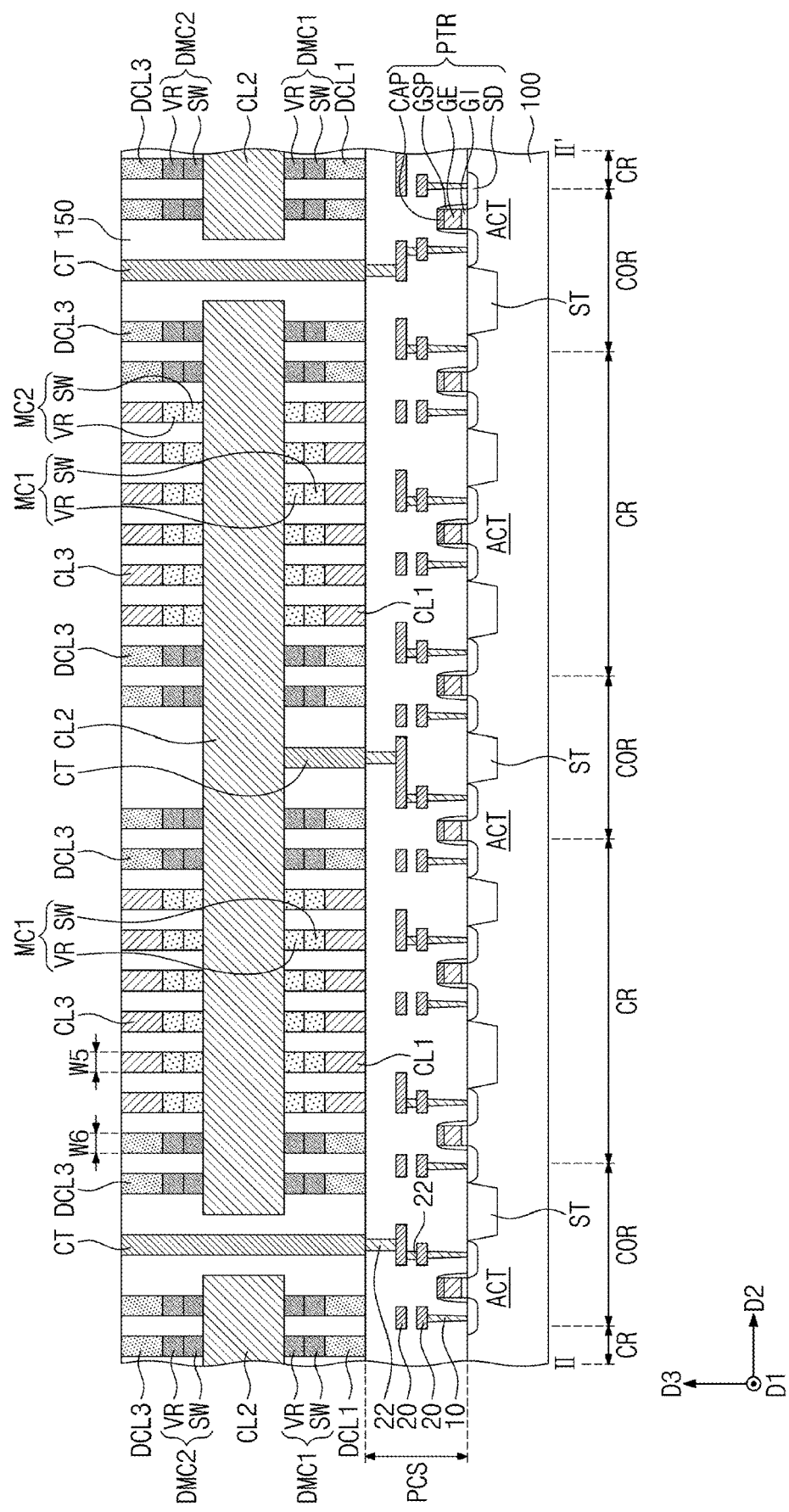

FIGS. 8A and 8B are cross-sectional views respectively corresponding to the lines I-I' and II-II' of FIG. 3 to illustrate a variable resistance memory device according to some embodiments. Hereinafter, differences between the present embodiments and the embodiments of FIGS. 3, 4, 5A and 5B will be mainly described for the purpose of ease and convenience in explanation.

Referring to FIGS. 3, 8A, and 8B, a peripheral circuit structure PCS may be disposed on the substrate 100. The peripheral circuit structure PCS may include device isolation patterns ST disposed in the substrate 100 to define active regions ACT, and peripheral transistors PTR disposed on the active regions ACT. The device isolation patterns ST may include at least one of, e.g., silicon oxide, silicon nitride, or silicon oxynitride.

Each of the peripheral transistors PTR may include a gate electrode GE on each of the active regions ACT, a gate insulating pattern GI between each of the active regions ACT and the gate electrode GE, a gate capping pattern CAP on a top surface of the gate electrode GE, gate spacers GSP on both sidewalls of the gate electrode GE, and source/drain regions SD disposed in each of the active regions ACT at both sides of the gate electrode GE. The gate electrode GE may include at least one of, e.g., a doped semiconductor material, a conductive metal nitride, or a metal. The gate insulating pattern GI may include at least one of, e.g., a silicon oxide layer, a silicon nitride layer, a silicon oxynitride layer, or a high-k dielectric layer. The high-k dielectric layer may include a material of which a dielectric constant is higher than that of a silicon oxide layer. For example, the high-k dielectric layer may include a hafnium oxide (HfO) layer, an aluminum oxide (AlO) layer, or a tantalum oxide (TaO) layer. Each of the gate capping pattern CAP and the gate spacers GSP may include at least one of, e.g., a silicon oxide layer, a silicon nitride layer, or a silicon oxynitride layer.

The peripheral circuit structure PCS may further include source/drain contacts 10 connected to the source/drain regions SD of each of the peripheral transistors PTR, interconnection lines 20 disposed above the peripheral transistors PTR, and interconnection contacts 22 connected to the interconnection lines 20. The source/drain regions SD of each of the peripheral transistors PTR may be connected to corresponding ones of the interconnection lines 20 through the source/drain contacts 10. The source/drain contacts 10, the interconnection lines 20, and the interconnection contacts 22 may include a conductive material (e.g., a metal).

The peripheral circuit structure PCS may further include a lower interlayer insulating layer 30 which is disposed on the substrate 100 and covers the peripheral transistors PTR, the source/drain contacts 10, the interconnection lines 20, and the interconnection contacts 22. The lower interlayer insulating layer 30 may cover the peripheral transistors PTR. The source/drain contacts 10, the interconnection lines 20, and the interconnection contacts 22 may be disposed in the lower interlayer insulating layer 30. For example, the lower interlayer insulating layer 30 may include at least one of, e.g., silicon oxide, silicon nitride, or silicon oxynitride.

The plurality of memory cell structures MCS and the dummy cell structure DCS may be disposed on the peripheral circuit structure PCS. The first conductive lines CL1 and the first dummy conductive lines DCL1 may be disposed on the lower interlayer insulating layer 30. The first conductive lines CL1 may be connected to corresponding ones of the interconnection contacts 22. Each of the first conductive lines CL1 may be electrically connected to a terminal (i.e., a corresponding source/drain region SD) of a corresponding peripheral transistor PTR through the corresponding interconnection contact 22 and corresponding interconnection lines 20. The first dummy conductive lines DCL1 may not be connected to the interconnection contacts 22 but may be electrically floated.

The second conductive lines CL2 and the second dummy conductive lines DCL2 may be disposed over the first conductive lines CL1 and the first dummy conductive lines DCL1, and may intersect the first conductive lines CL1 and the first dummy conductive lines DCL1. Each of the second conductive lines CL2 may be connected to a corresponding one of the conductive contacts CT. Each of the second conductive lines CL2 may be connected to a corresponding interconnection contact 22 and corresponding interconnection lines 20 through the corresponding conductive contact CT and may be electrically connected to a terminal (i.e., a corresponding source/drain region SD) of a corresponding peripheral transistor PTR through the corresponding interconnection contact 22 and the corresponding interconnection lines 20. The second dummy conductive lines DCL2 may not be connected to the conductive contacts CT and the interconnection contacts 22 but may be electrically floated.

First memory cells MC1 may be disposed at intersection points of the first conductive lines CL1 and the second conductive lines CL2, respectively. First dummy memory cells DMC1 may be disposed at intersection points of the second dummy conductive lines DCL2 and the first dummy conductive lines DCL1, intersection points of the second dummy conductive lines DCL2 and the first conductive lines CL1, and intersection points of the second conductive lines CL2 and the first dummy conductive lines DCL1, respectively. The first memory cells MC1 and the first dummy memory cells DMC1 may be the same as the memory cells MC and the dummy memory cells DMC, described with reference to FIGS. 3, 4, 5A and 5B.

In some embodiments, third conductive lines CL3 and third dummy conductive lines DCL3 may be disposed over the second conductive lines CL2 and the second dummy conductive lines DCL2, and may intersect the second conductive lines CL2 and the second dummy conductive lines DCL2. The third conductive lines CL3 and the third dummy conductive lines DCL3 may extend in the first direction D1 and may be spaced apart from each other in the second direction D2. The third conductive lines CL3 and the third dummy conductive lines DCL3 may have widths in the second direction D2. In some embodiments, a fifth width W5 of each of the third conductive lines CL3 may be equal to a sixth width W6 of each of the third dummy conductive lines DCL3. The third dummy conductive lines DCL3 may include the same material as the third conductive lines CL3. For example, the third dummy conductive lines DCL3 and the third conductive lines CL3 may include at least one of a doped semiconductor material (e.g., doped silicon), a metal (e.g., tungsten, aluminum, titanium, or tantalum), a conductive metal nitride (e.g., titanium nitride, tantalum nitride, or tungsten nitride), or a metal-semiconductor compound (e.g., a metal silicide).

Each of the third conductive lines CL3 may be connected to a corresponding one of the conductive contacts CT. Each of the third conductive lines CL3 may be connected to a corresponding interconnection contact 22 and corresponding interconnection lines 20 through the corresponding conductive contact CT, and may be electrically connected to a terminal (i.e., a corresponding source/drain region SD) of a corresponding peripheral transistor PTR through the corresponding interconnection contact 22 and the corresponding interconnection lines 20. The third dummy conductive lines DCL3 may not be connected to the conductive contacts CT and the interconnection contacts 22 but may be electrically floated.

The plurality of memory cell structures MCS may include a pair of memory cell structures MCS adjacent to each other in the first direction D1. The pair of memory cell structures MCS may be respectively disposed on a pair of cell regions CR, adjacent to each other in the first direction D1, of the plurality of cell regions CR. In some embodiments, the pair of memory cell structures MCS may share the third conductive lines CL3. In this case, the third conductive lines CL3 may extend from one of the pair of cell regions CR onto the core region COR provided between the pair of cell regions CR and may extend onto the other of the pair of cell regions CR across the core region COR provided between the pair of cell regions CR.

Second memory cells MC2 may be disposed at intersection points of the second conductive lines CL2 and the third conductive lines CL3, respectively. Second dummy memory cells DMC2 may be disposed at intersection points of the third dummy conductive lines DCL3 and the second dummy conductive lines DCL2, intersection points of the third dummy conductive lines DCL3 and the second conductive lines CL2, and intersection points of the third conductive lines CL3 and the second dummy conductive lines DCL2, respectively. The second memory cells MC2 and the second dummy memory cells DMC2 may be substantially the same as the memory cells MC and the dummy memory cells DMC, described with reference to FIGS. 3, 4, 5A and 5B.

The interlayer insulating layer 150 may be disposed on the peripheral circuit structure PCS. The interlayer insulating layer 150 may cover sidewalls of the first conductive lines CL1, sidewalls of the first dummy conductive lines DCL1, sidewalls of the first memory cells MC1, sidewalls of the first dummy memory cells DMC1, sidewalls of the second conductive lines CL2, sidewalls of the second dummy conductive lines DCL2, sidewalls of the second memory cells MC2, sidewalls of the second dummy memory cells DMC2, sidewalls of the third conductive lines CL3, and sidewalls of the third dummy conductive lines DCL3.

Figure 9A:
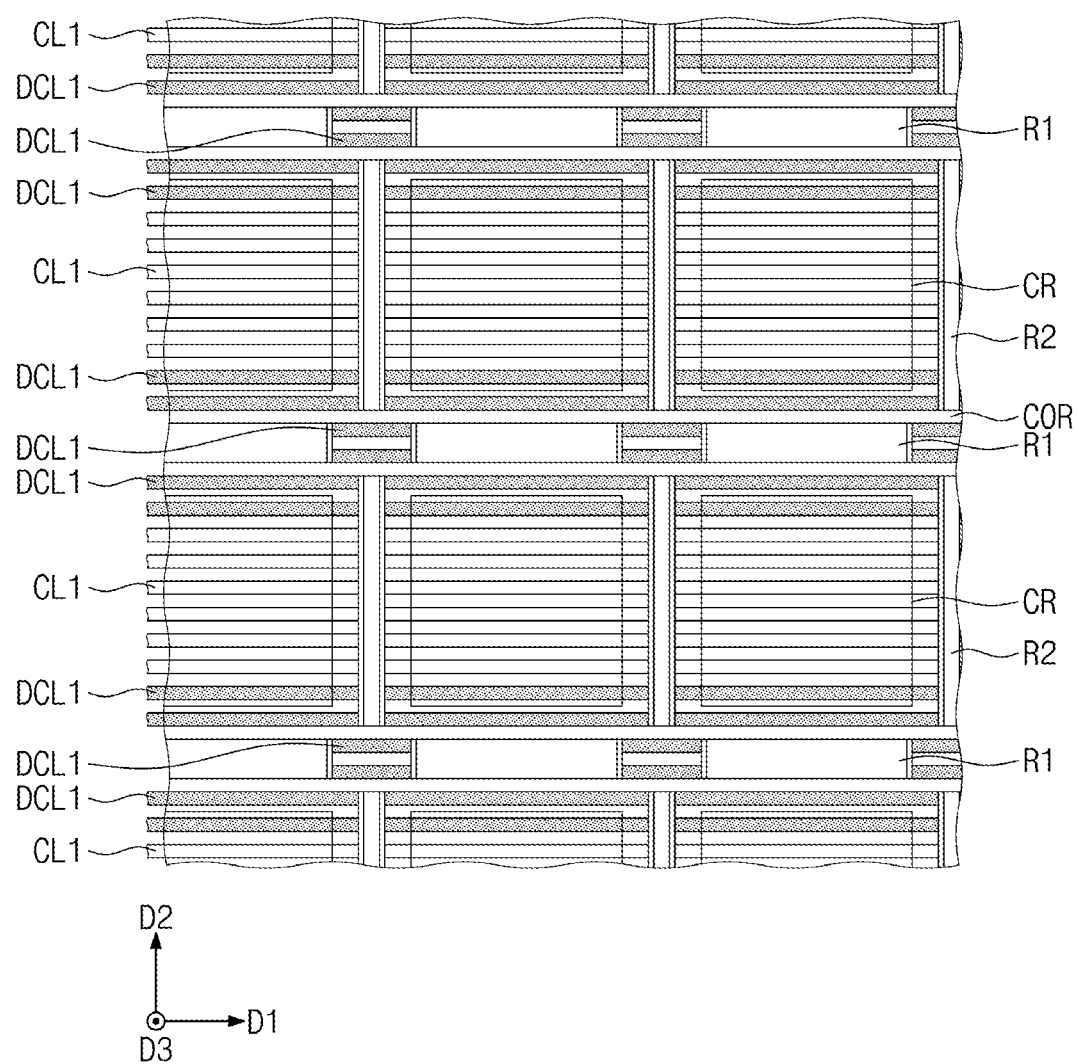
FIGS. 9A and 9B are plan views of a method of manufacturing a variable resistance memory device according to some embodiments.
Figure 9B:
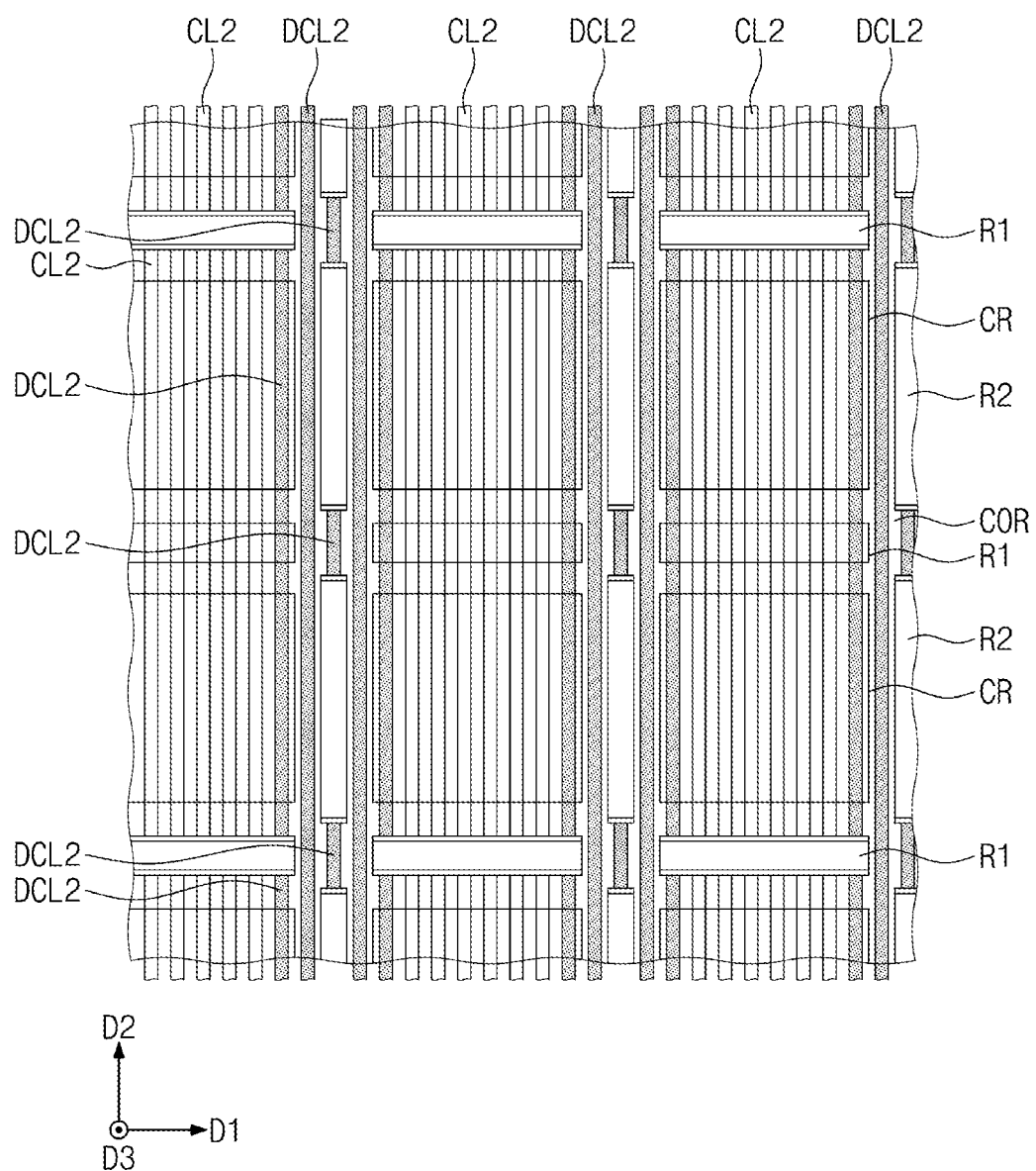

FIGS. 9A and 9B are plan views of a method of manufacturing a variable resistance memory device according to some embodiments. Hereinafter, the descriptions to the same technical features as in the embodiments of FIGS. 3, 4, 5A and 5B will be omitted for the purpose of ease and convenience in explanation.

Referring to FIG. 9A, the first conductive lines CL1 (white lines in FIG. 9A) and the first dummy conductive lines DCL1 (gray lines in FIG. 9A) may be formed on the substrate 100. For example, the formation of the first conductive lines CL1 and the first dummy conductive lines DCL1 may include forming a first conductive layer on the substrate 100, and patterning the first conductive layer. The first conductive lines CL1 and the first dummy conductive lines DCL1 may be formed simultaneously, i.e., at the same time by the same patterning process of the first conductive layer.

The first conductive lines CL1 and the first dummy conductive lines DCL1 may extend long, e.g., lengthwise, in the first direction D1 and may be spaced apart from each other in the second direction D2. According to some embodiments, the first conductive lines CL1 may extend from each of the plurality of cell regions CR onto the core region COR in the first direction D1. The first dummy conductive lines DCL1 may be formed on the core region COR. Some of the first dummy conductive lines DCL1 may intersect edges of each of the plurality of cell regions CR and may extend onto the core region COR.

First dummy conductive lines DCL1, adjacent to the first conductive lines CL1, of the first dummy conductive lines DCL1 may be connected to the first conductive lines CL1 along the second direction D2 on the core region COR adjacent to the second contact regions R2. Some of the first dummy conductive lines DCL1 may be connected to each other along the second direction D2 on the core region COR adjacent to the first contact regions R1. When the first conductive lines CL1 and the first dummy conductive lines DCL1 are formed to have line shapes extending long in the first direction D1, a collapse phenomenon of the first conductive lines CL1 and the first dummy conductive lines DCL1 may occur. However, according to the embodiments, at least some of the first conductive lines CL1 and the first dummy conductive lines DCL1 may be formed to be connected to each other along the second direction D2 on the core region COR. Thus, the collapse phenomenon of the first conductive lines CL1 and the first dummy conductive lines DCL1 may be minimized or prevented.

The connected portions of the first conductive lines CL1 and the first dummy conductive lines DCL1 may be removed by a first trimming process. As a result, as described with reference to FIGS. 3, 4, 5A and 5B, the ends CL1E of the first conductive lines CL1 may be aligned with each other in the second direction D2 on the core region COR adjacent to the second contact regions R2, and the ends DCL1E of the first dummy conductive lines DCL1 adjacent to the first conductive lines CL1 may be aligned with the ends CL1E of the first conductive lines CL1 in the second direction D2 on the core region COR adjacent to the second contact regions R2. In addition, ends of some of the first dummy conductive lines DCL1 may be aligned with each other in the second direction D2 on the core region COR adjacent to the first contact regions R1.

Referring again to FIGS. 3, 4, 5A and 5B, the memory cells MC and the dummy memory cells DMC may be formed on the first conductive lines CL1 and the first dummy conductive lines DCL1. The memory cells MC and the dummy memory cells DMC may be arranged in the first direction D1 along top surfaces of the first conductive lines CL1 and the first dummy conductive lines DCL1, and may be spaced apart from each other in the second direction D2. For example, the formation of the memory cells MC and the dummy memory cells DMC may include sequentially forming a switching layer and a variable resistance layer on the first conductive lines CL1 and the first dummy conductive lines DCL1, and sequentially etching the variable resistance layer and the switching layer. The variable resistance pattern VR and the switching pattern SW of each of the memory cells MC and the dummy memory cells DMC may be formed by the etching of the variable resistance layer and the switching layer. The memory cells MC and the dummy memory cells DMC may be formed at the same time by the etching of the variable resistance layer and the switching layer.

Referring to FIG. 9B, the second conductive lines CL2 and the second dummy conductive lines DCL2 may be formed on the substrate 100. The second conductive lines CL2 and the second dummy conductive lines DCL2 may be formed on the substrate 100 having the first conductive lines CL1, the first dummy conductive lines DCL1, the memory cells MC, and the dummy memory cells DMC. However, the components except the second conductive lines CL2 and the second dummy conductive lines DCL2 are omitted in FIG. 9B for the purpose of ease and convenience in illustration. For example, the formation of the second conductive lines CL2 and the second dummy conductive lines DCL2 may include forming a second conductive layer on the substrate 100, and patterning the second conductive layer. The second conductive lines CL2 and the second dummy conductive lines DCL2 may be formed simultaneously, e.g., at the same time by the same patterning process of the second conductive layer.

The second conductive lines CL2 and the second dummy conductive lines DCL2 may extend long, e.g., lengthwise, in the second direction D2 and may be spaced apart from each other in the first direction D1. According to some embodiments, the second conductive lines CL2 may extend from each of the plurality of cell regions CR onto the core region COR in the second direction D2. The second dummy conductive lines DCL2 may be formed on the core region COR. Some of the second dummy conductive lines DCL2 may intersect edges of each of the plurality of cell regions CR and may extend onto the core region COR.

Second dummy conductive lines DCL2, adjacent to the second conductive lines CL2, of the second dummy conductive lines DCL2 may be connected to the second conductive lines CL2 along the first direction D1 on the core region COR adjacent to the first contact regions R1. Some of the second dummy conductive lines DCL2 may be connected to each other along the first direction D1 on the core region COR adjacent to the second contact regions R2.

When the second conductive lines CL2 and the second dummy conductive lines DCL2 are formed to have line shapes extending long in the second direction D2, a collapse phenomenon of the second conductive lines CL2 and the second dummy conductive lines DCL2 may occur. However, according to the embodiments, at least some of the second conductive lines CL2 and the second dummy conductive lines DCL2 may be formed to be connected to each other along the first direction D1 on the core region COR. Thus, the collapse phenomenon of the second conductive lines CL2 and the second dummy conductive lines DCL2 may be minimized or prevented.

The connected portions of the second conductive lines CL2 and the second dummy conductive lines DCL2 may be removed by a second trimming process. As a result, as described with reference to FIGS. 3, 4, 5A and 5B, the ends CL2E of the second conductive lines CL2 may be aligned with each other in the first direction D1 on the core region COR adjacent to the first contact regions R1, and the ends DCL2E of the second dummy conductive lines DCL2 adjacent to the second conductive lines CL2 may be aligned with the ends CL2E of the second conductive lines CL2 in the first direction D1 on the core region COR adjacent to the first contact regions R1. In addition, ends of some of the second dummy conductive lines DCL2 may be aligned with each other in the first direction D1 on the core region COR adjacent to the second contact regions R2.

Referring again to FIGS. 3, 4, 5A and 5B, the memory cells MC may be disposed at intersection points of the first conductive lines CL1 and the second conductive lines CL2, respectively. The dummy memory cells DMC may be disposed at intersection points of the second dummy conductive lines DCL2 and the first dummy conductive lines DCL1, intersection points of the second dummy conductive lines DCL2 and the first conductive lines CL1, and intersection points of the second conductive lines CL2 and the first dummy conductive lines DCL1, respectively. The interlayer insulating layer 150 may be formed on the substrate 100 and may cover sidewalls of the first conductive lines CL1, the first dummy conductive lines DCL1, the memory cells MC, the dummy memory cells DMC, the second conductive lines CL2, and the second dummy conductive lines DCL2. The conductive contacts CT may be formed on the first and second contact regions R1 and R2. The conductive contacts CT may penetrate the interlayer insulating layer 150 and may be electrically connected to transistors on the substrate 100.

Figure 10:
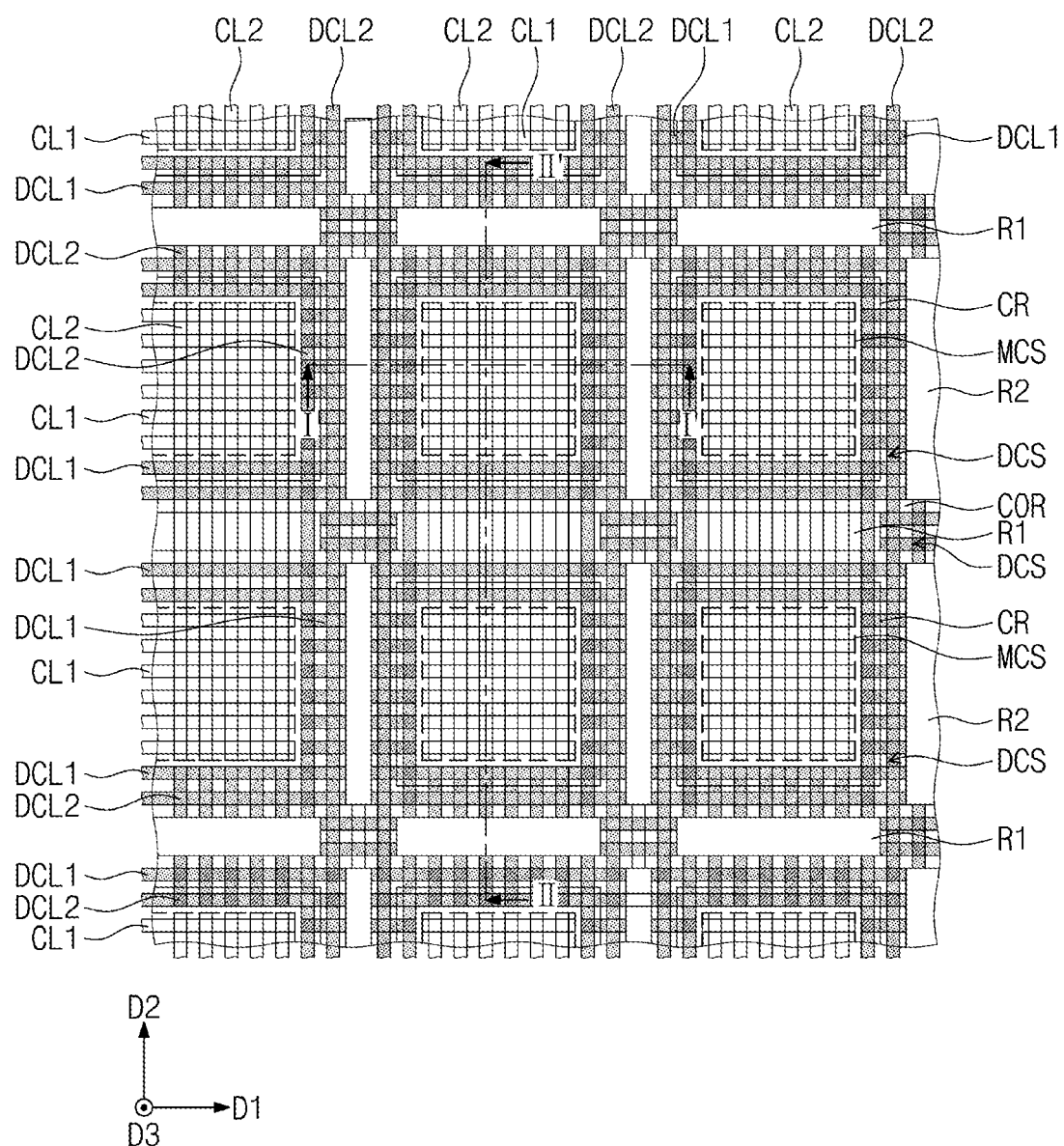
FIG. 10 is a plan view of a variable resistance memory device according to some embodiments.
Figure 11:
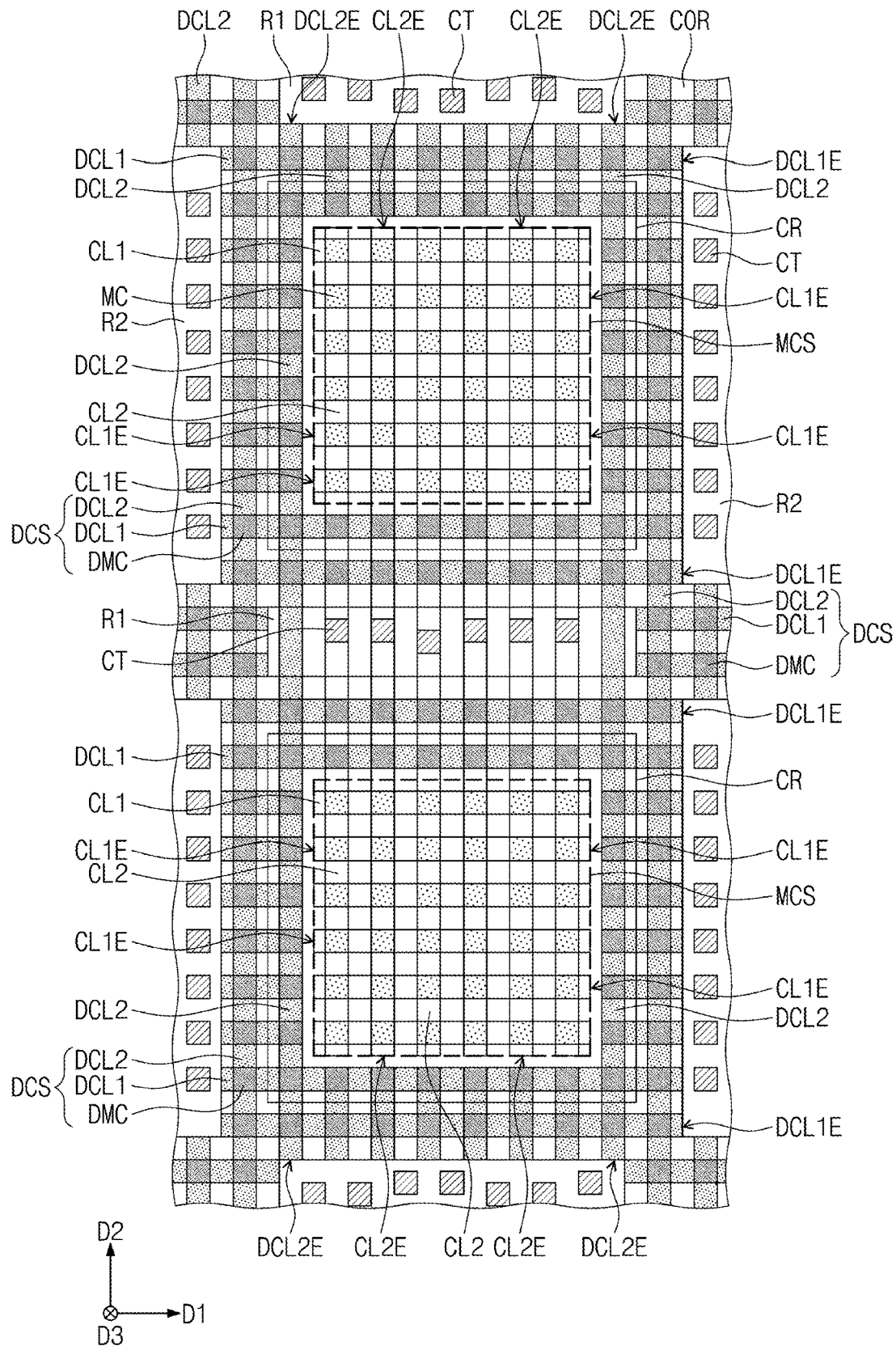
FIG. 11 is an enlarged view of a portion of the variable resistance memory device of FIG. 10.
Figure 12A:
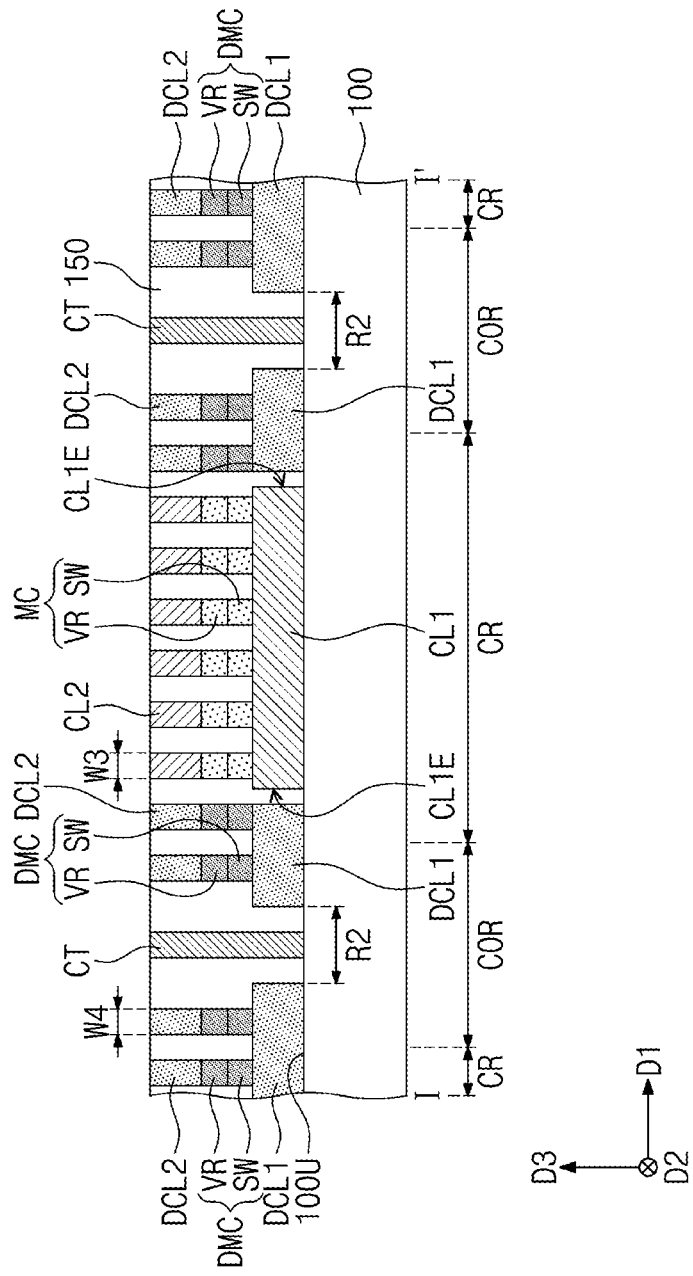
FIGS. 12A and 12B are cross-sectional views along lines I-I' and II-II' of FIG. 10, respectively.
Figure 12B:
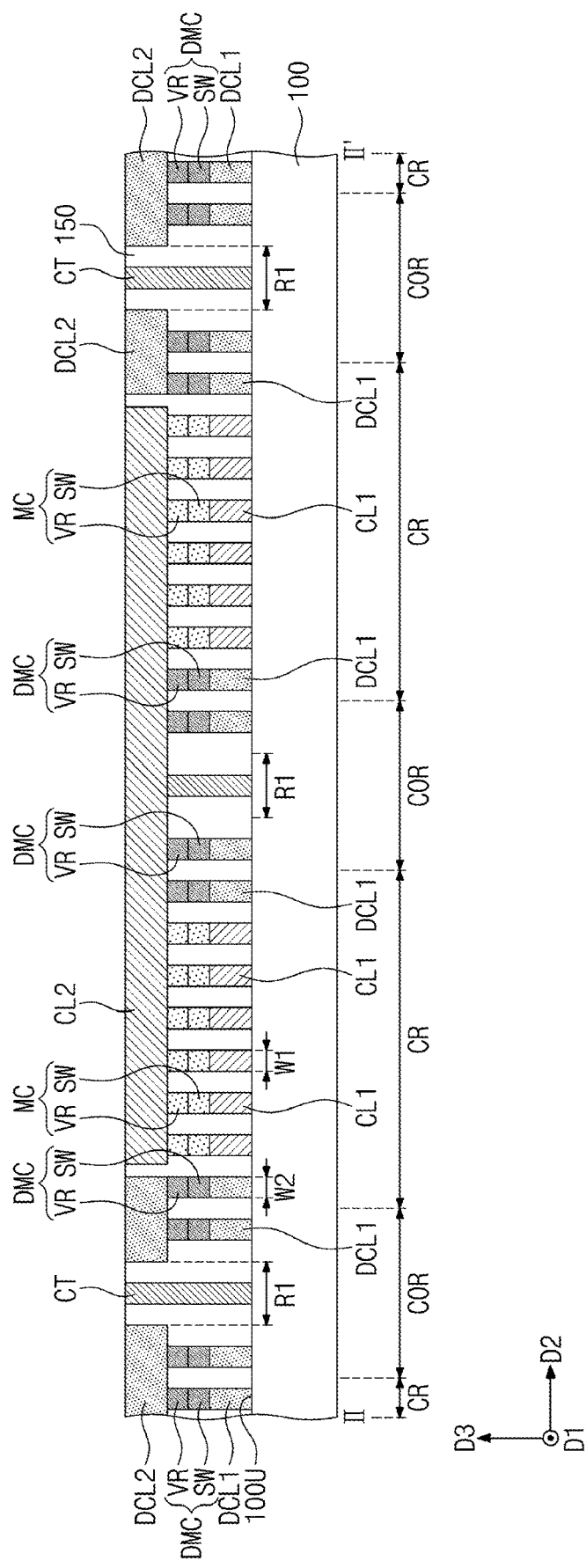

FIG. 10 is a plan view of a variable resistance memory device according to some embodiments. FIG. 11 is an enlarged view of a portion of the variable resistance memory device of FIG. 10. FIGS. 12A and 12B are cross-sectional views taken along lines I-I' and II-II' of FIG. 10, respectively. Hereinafter, differences between the present embodiments and the embodiments of FIGS. 3, 4, 5A and 5B will be mainly described for the purpose of ease and convenience in explanation.

Referring to FIGS. 10, 11, 12A and 12B, a plurality of memory cell structures MCS may be disposed on the plurality of cell regions CR, respectively. The plurality of memory cell structures MCS may be spaced apart from each other in the first direction D1 and the second direction D2. Each of the plurality of memory cell structures MCS may include the first conductive lines CL1, the second conductive lines CL2 disposed on the first conductive lines CL1 and intersecting the first conductive lines CL1, and the memory cells MC between the first conductive lines CL1 and the second conductive lines CL2. The first conductive lines CL1 may extend in the first direction D1 and may be spaced apart from each other in the second direction D2. The second conductive lines CL2 may extend in the second direction D2 and may be spaced apart from each other in the first direction D1. The memory cells MC may be disposed at intersection points of the first conductive lines CL1 and the second conductive lines CL2, respectively.

In some embodiments, the first conductive lines CL1 may be locally disposed on each of the plurality of cell regions CR. In other words, the first conductive lines CL1 may not extend onto the core region COR. The ends CL1E of the first conductive lines CL1 may be aligned with each other in the second direction D2 on each of the plurality of cell regions CR. The ends CL2E of the second conductive lines CL2 may be aligned with each other in the first direction D1 on each of the plurality of cell regions CR.

The plurality of memory cell structures MCS may include a pair of memory cell structures MCS adjacent to each other in the second direction D2. The pair of memory cell structures MCS may be respectively disposed on a pair of cell regions CR, adjacent to each other in the second direction D2, of the plurality of cell regions CR. In some embodiments, the pair of memory cell structures MCS may share the second conductive lines CL2. In this case, the second conductive lines CL2 may extend from one of the pair of cell regions CR onto the core region COR provided between the pair of cell regions CR and may extend onto the other of the pair of cell regions CR across the core region COR provided between the pair of cell regions CR.

A dummy cell structure DCS may be disposed on the core region COR. The dummy cell structure DCS may surround each of the plurality of memory cell structures MCS in a plan view, and may extend between the plurality of memory cell structures MCS to form one body. The dummy cell structure DCS may be a single dummy cell structure DCS disposed between the plurality of memory cell structures MCS. The dummy cell structure DCS may include first dummy conductive lines DCL1, second dummy conductive lines DCL2 disposed on the first dummy conductive lines DCL1 and intersecting the first dummy conductive lines DCL1, and dummy memory cells DMC between the first dummy conductive lines DCL1 and the second dummy conductive lines DCL2.

The first dummy conductive lines DCL1 may extend in the first direction D1 and may be spaced apart from each other in the second direction D2. In some embodiments, some of the first dummy conductive lines DCL1 may be spaced apart from the ends CL1E of the first conductive lines CL1 in the first direction D1. The second dummy conductive lines DCL2 may extend in the second direction D2 and may be spaced apart from each other in the first direction D1. In some embodiments, some of the second dummy conductive lines DCL2 may be spaced apart from the ends CL2E of the second conductive lines CL2 in the second direction D2.

In some embodiments, the second dummy conductive lines DCL2 may intersect the first dummy conductive lines DCL1, and the second conductive lines CL2 may intersect the first conductive lines CL1 and the first dummy conductive lines DCL1. The dummy memory cells DMC may be disposed at intersection points of the second dummy conductive lines DCL2 and the first dummy conductive lines DCL1 and intersection points of the second conductive lines CL2 and the first dummy conductive lines DCL1, respectively.

According to embodiments, the dummy cell structure DCS may be disposed on the core region COR to surround each of the plurality of memory cell structures MCS, and may extend along the core region COR between the plurality of memory cell structures MCS to form one body. The dummy cell structure DCS may have the same stack structure as the plurality of memory cell structures MCS. In this case, a difference in pattern density between each of the cell regions CR and the core region COR may be minimized, and thus it is possible to inhibit or prevent defects of the outermost memory cells MC of each of the memory cell structures MCS from occurring in a manufacturing process. In addition, since the dummy cell structure DCS is formed to have the same stack structure as the plurality of memory cell structures MCS, it may be easy to, e.g., simultaneously, form the plurality of memory cell structures MCS and the dummy cell structure DCS. As a result, it is possible to realize or provide the variable resistance memory device capable of minimizing defects of memory cells and of being easily manufactured.

According to embodiments, the dummy cell structure may be disposed on the core region of the substrate. The dummy cell structure may surround each of the plurality of memory cell structures spaced apart from each other and may extend between the plurality of memory cell structures to form one body. The dummy cell structure may have the same stack structure as the plurality of memory cell structures. In this case, a difference in pattern density between the core region, on which the dummy cell structure is disposed, and the cell regions, on which the memory cell structures are disposed, may be minimized, and thus it is possible to inhibit or prevent defects of the outermost memory cells of each of the memory cell structures from occurring in a manufacturing process. In addition, since the dummy cell structure has the same stack structure as the memory cell structures, the memory cell structures and the dummy cell structure may be easily formed. As a result, it is possible to realize or provide the variable resistance memory device capable of minimizing defects of memory cells and of being easily manufactured.

By way of summation and review, embodiments may provide a variable resistance memory device capable of minimizing defects of memory cells. Embodiments may also provide a variable resistance memory device capable of being easily manufactured.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A variable resistance memory device, comprising:
a substrate;
memory cell structures on the substrate, the memory cell structures being spaced apart from each other in a first direction and a second direction, and the first direction and the second direction being parallel to a top surface of the substrate and intersecting each other; and
a dummy cell structure surrounding each of the memory cell structures, as viewed in a plan view, the dummy cell structure being a single body structure extending continuously between all the memory cell structures,
wherein each of the memory cell structures includes:
first conductive lines;
second conductive lines on the first conductive lines and intersecting the first conductive lines; and
memory cells between the first conductive lines and the second conductive lines, and
wherein the dummy cell structure includes:
first dummy conductive lines;
second dummy conductive lines on the first dummy conductive lines and intersecting the first dummy conductive lines; and
dummy memory cells between the first dummy conductive lines and the second dummy conductive lines.

2. The variable resistance memory device as claimed in claim 1, wherein:
the first conductive lines extend in the first direction and are spaced apart from each other in the second direction, and
the first dummy conductive lines extend in the first direction and are spaced apart from each other in the second direction.

3. The variable resistance memory device as claimed in claim 2, wherein each of the memory cell structures is between a pair of the first dummy conductive lines that are spaced apart from each other in the second direction.

4. The variable resistance memory device as claimed in claim 3, wherein:
each of the first conductive lines has a first width in the second direction, and
each of the first dummy conductive lines has a second width in the second direction, the second width being equal to the first width.

5. The variable resistance memory device as claimed in claim 3, wherein:
the second conductive lines extend in the second direction and are spaced apart from each other in the first direction, and
the second dummy conductive lines extend in the second direction and are spaced apart from each other in the first direction.

6. The variable resistance memory device as claimed in claim 5, wherein each of the memory cell structures is between a pair of the second dummy conductive lines that are spaced apart from each other in the first direction.

7. The variable resistance memory device as claimed in claim 6, wherein:
each of the second conductive lines has a third width in the first direction, and
each of the second dummy conductive lines has a fourth width in the first direction, the third width being equal to the fourth width.

8. The variable resistance memory device as claimed in claim 6, wherein:
the substrate includes cell regions, on which the memory cell structures are positioned, and a core region between the cell regions,
the first conductive lines extend from each of the cell regions onto the core region in the first direction, and ends of the first conductive lines are aligned with each other in the second direction on the core region.

9. The variable resistance memory device as claimed in claim 8, wherein:

the second conductive lines extend from each of the cell regions onto the core region in the second direction, and ends of the second conductive lines are aligned with each other in the first direction on the core region.

10. The variable resistance memory device as claimed in claim 9, wherein:

the second conductive lines intersect some of the first dummy conductive lines, and some of the second dummy conductive lines intersect the first conductive lines.

11. The variable resistance memory device as claimed in claim 10, wherein the dummy memory cells are at intersection points of the second dummy conductive lines and the first dummy conductive lines, intersection points of the second dummy conductive lines and the first conductive lines, and intersection points of the second conductive lines and the first dummy conductive lines, respectively.

12. The variable resistance memory device as claimed in claim 6, wherein:

the substrate includes cell regions, on which the memory cell structures are positioned, and a core region between the cell regions, ends of the first conductive lines are aligned with each other in the second direction on each of the cell regions, and ends of the second conductive lines are aligned with each other in the first direction on each of the cell regions.

13. The variable resistance memory device as claimed in claim 1, wherein:

the substrate includes cell regions, on which the memory cell structures are positioned, and a core region between the cell regions, and the dummy cell structure is on the core region and is in the single body structure that extends continuously along the core region.

14. The variable resistance memory device as claimed in claim 13, wherein:

the core region includes a contact region on which conductive contacts are positioned, and the dummy cell structure extends along the core region except the contact region.

15. The variable resistance memory device as claimed in claim 14, further comprising a peripheral circuit structure on the substrate, wherein the memory cell structures, the dummy cell structure, and the conductive contacts are on the peripheral circuit structure, and wherein the conductive contacts are electrically connected to peripheral transistors of the peripheral circuit structure.

16. The variable resistance memory device as claimed in claim 1, wherein each of the memory cells and the dummy memory cells includes a variable resistance pattern and a switching pattern, which are stacked in a third direction perpendicular to the top surface of the substrate.

17. A variable resistance memory device, comprising:

a substrate;

memory cell structures spaced apart from each other in a first direction and a second direction on the substrate, the first and second directions being parallel to a top surface of the substrate and intersecting each other; and a single dummy cell structure between the memory cell structures, wherein the single dummy cell structure extends between adjacent ones of the memory cell structures that are spaced apart from each other in the first direction, and between adjacent ones of the memory cell structures that are spaced apart from each other in the second direction, wherein each of the memory cell structures includes:

first conductive lines;

second conductive lines on and intersecting the first conductive lines; and memory cells between the first conductive lines and the second conductive lines, and wherein the single dummy cell structure includes:

first dummy conductive lines;

second dummy conductive lines on and intersecting the first dummy conductive lines; and dummy memory cells between the first dummy conductive lines and the second dummy conductive lines.

18. The variable resistance memory device as claimed in claim 17, wherein the single dummy cell structure surrounds each of the memory cell structures when viewed in a plan view.

19. The variable resistance memory device as claimed in claim 17, wherein:

the first dummy conductive lines include a same material as the first conductive lines, and the second dummy conductive lines include a same material as the second conductive lines.

20. The variable resistance memory device as claimed in claim 17, wherein each of the memory cells and the dummy memory cells includes a variable resistance pattern and a switching pattern, which are stacked in a third direction perpendicular to the top surface of the substrate.

* * * * *